United States Patent
Yoshikawa

(10) Patent No.: US 7,848,594 B2
(45) Date of Patent: Dec. 7, 2010

(54) MEASUREMENT METHOD, TRANSFER CHARACTERISTIC MEASUREMENT METHOD, ADJUSTMENT METHOD OF EXPOSURE APPARATUS, AND DEVICE MANUFACTURING METHOD

(75) Inventor: Iori Yoshikawa, Saitama (JP)

(73) Assignee: Nikon Corporation, Tokyo (JP)

( * ) Notice: Subject to any disclaimer, the term of this patent is extended or adjusted under 35 U.S.C. 154(b) by 1086 days.

(21) Appl. No.: 10/589,336

(22) PCT Filed: Jan. 12, 2005

(86) PCT No.: PCT/JP2005/000205

§ 371 (c)(1),
(2), (4) Date: Oct. 17, 2006

(87) PCT Pub. No.: WO2005/078775

PCT Pub. Date: Aug. 25, 2005

(65) Prior Publication Data

US 2007/0181825 A1    Aug. 9, 2007

(30) Foreign Application Priority Data

Feb. 13, 2004    (JP) .............................. 2004-036458

(51) Int. Cl.
*G06K 9/46* (2006.01)
*G06T 7/00* (2006.01)
(52) U.S. Cl. ........................ 382/286; 382/144; 382/145; 382/287; 438/16
(58) Field of Classification Search ................. 382/141, 382/144, 145, 151, 286, 287, 289; 348/86, 348/87; 438/16
See application file for complete search history.

(56) References Cited

U.S. PATENT DOCUMENTS

| 4,547,895 | A | * | 10/1985 | Mita et al. | .................. | 382/144 |
| 5,181,258 | A | * | 1/1993 | Nagao et al. | ................ | 382/206 |
| 6,094,256 | A | * | 7/2000 | Grodnensky et al. | .......... | 355/77 |
| 2005/0106480 | A1 | * | 5/2005 | Suwa | .......................... | 430/30 |
| 2006/0251317 | A1 | * | 11/2006 | Eran et al. | .................. | 382/144 |

FOREIGN PATENT DOCUMENTS

| JP | A 04-132909 | 5/1992 |
| JP | A 05-062882 | 3/1993 |
| JP | A 06-181155 | 6/1994 |
| JP | A 2003-086497 | 3/2003 |
| JP | A 2004-047737 | 2/2004 |

* cited by examiner

*Primary Examiner*—Jon Chang
(74) *Attorney, Agent, or Firm*—Oliff & Berridge, PLC

(57) ABSTRACT

Exposure is performed with a reticle installed in an exposure apparatus, and a measurement mark on the reticle is transferred onto a wafer so as to form a first transferred image of the measurement mark (step 212). Then, the wafer is rotated (step 218), and then the measurement mark is transferred onto the wafer that has been rotated and a second transferred image of the measurement mark is formed (step 224). In this manner, the first transferred image and the second transferred image of the measurement mark each formed on the wafer are respectively imported by an SEM, according to a direction of the wafer with respect to the reticle during transfer of the measurement mark. Image processing having a common measurement direction is applied to each of the images that are imported without having to rotate the images, and the size of the first transferred image and the second transferred image in the measurement directions is measured. Accordingly, degradation of the size measurement accuracy of the mark due to the combination of image import and image processing can be prevented.

48 Claims, 7 Drawing Sheets

MEASUREMENT METHOD, TRANSFER CHARACTERISTIC MEASUREMENT METHOD, ADJUSTMENT METHOD OF EXPOSURE APPARATUS, AND DEVICE MANUFACTURING METHOD

TECHNICAL FIELD

The present invention relates to measurement methods, transfer characteristic measurement methods, adjustment methods of exposure apparatus, and device manufacturing methods, and more particularly to a measurement method in which size information of a mark formed on an object is measured in at least two directions, a transfer characteristic measurement method in which a transfer characteristic of a pattern by an exposure apparatus is measured based on the size of a mark (a transferred image of a measurement mark) formed on an object by the exposure apparatus, an adjustment method of an exposure apparatus that uses the transfer characteristic measurement method, and a device manufacturing method that uses the exposure apparatus adjusted by the adjustment method.

BACKGROUND ART

Generally, in an lithography process for manufacturing microdevices such as a semiconductor device, a display device (such as a liquid crystal display device), an imaging device (such as a CCD), a thin-film magnetic head, or a micromachine, various exposure apparatus are used that transfer a pattern formed on a mask or reticle (hereinafter generally referred to as 'reticle') onto an object such as a wafer or a glass plate (hereinafter generally referred to as 'wafer'). In recent years, from the viewpoint of placing importance on throughput, a projection exposure apparatus of a sequentially moving type is mainly used, such as a reduction projection exposure apparatus (the so-called stepper) by a step-and-repeat method, or a scanning exposure apparatus (the so-called scanner (also referred to as a scanning stepper) by a step-and-scan method.

Because this type of projection exposure apparatus is used for manufacturing microdevices, in order to make a device, which serves as an end product, exert a desired performance, it is important to accurately form a reduced image (an image reduced to a size according to a projection magnification that has a similar shape to an original pattern) of a pattern formed on a reticle that corresponds to a projection magnification of a projection optical system on a wafer. Especially in a transferred image of a pattern that has the same size as the pattern on the reticle, it is important that the transferred image can be formed in the same size within the entire effective field or exposure field of the projection optical system. That is, the in-plane uniformity of the pattern size is important. For example, in the case of a line pattern, the line width of the image should be uniform within the plane, while the line width uniformity is important also in between vertical lines and horizontal lines.

The in-plane uniformity of the pattern size described above or the like is greatly influenced by the image-forming characteristics of the projection optical system, and for example, in the case aberrations such as curvature of field, spherical aberration, coma, or distortion exist in the projection optical system, the formed state of the image of the pattern of the same size formed at different positions will be different. Further, in the case astigmatism exists in the projection optical system, the formed state of a resist image of a horizontal line pattern and a resist image of a vertical line pattern of the same size will be different. This means, when expressed from an opposite point of view, that in the case a plurality of transferred images (e.g. resist images) of a pattern of the same size each transferred on a wafer via the projection optical system is measured, the image-forming characteristics of the projection optical system can be determined based on the measurement results, and furthermore, adjustment of the exposure apparatus such as the adjustment of the image-forming characteristics of the projection optical system becomes possible.

In recent years, due to finer patterns, when measuring the size of the resist image formed on the wafer (e.g. the line width or the like in the case of a line pattern), a scanning electron microscope (SEM) (hereinafter simply referred to as 'SEM') for length measuring is normally used as the measurement unit.

However, in the case a pattern on a reticle is transferred onto a wafer by an exposure apparatus, and line width measurement of a resist image formed on substantially the same position on the wafer is performed using a commercially available SEM system for length measurement after the wafer has been developed, the situation has frequently begun to occur where the measurement results contain a line width difference in the resist image of a vertical line pattern and the resist image of a horizontal line pattern that cannot satisfy the specification of pattern line width controllability required in recent exposure apparatus even if adjustment of the exposure apparatus has been repeatedly performed countless times, which unexpectedly increases the start-up time of the exposure apparatus within the semiconductor factory.

Because it is certain that the specification of the pattern line width controllability required in the exposure apparatus will become tighter in the future, it is important to develop a new technology that can reduce the line width difference described above.

DISCLOSURE OF INVENTION

Means for Solving the Problems

The inventor of the present invention repeatedly performed various experiments in order to accurately acquire the cause of the line width difference between the resist image of the vertical line pattern and the resist image of the horizontal line pattern described above, and as a consequence, confirmed that the results acquired by the SEM used for measurement described above contains the line difference described above, even if the projection optical system is adjusted to a level where aberration can hardly be detected. And from this, the inventor of the present invention reached a conclusion that the line width difference above is mostly due to some kind of a measurement error, and analyzed the series of processing of the line width measurement. As a result, the inventor found out that the generation factor of the measurement error above lies in the combination of the image import of the resist image by the SEM and the image processing of the image including the edge detection processing performed after the image import, and was almost certain that the main cause of the measurement error above was due to performing the edge detection process on the image whose image of only the horizontal line pattern of the resist image was rotated, especially in the process of the image processing.

The present invention has been made according to the investigation results of the generation factor of the measurement errors described above acquired by the inventor, and according to a first aspect of the present invention, there is provided a measurement method in which size information related to at least two directions of a mark formed on an object is measured, the method comprising: a first image import process in which a first image of the mark is imported by a measurement unit in a first state where the object is set to a reference direction; a second image import process in which a second image of the mark is imported by the measurement unit in a second state where at least a part of the mark is rotated by a predetermined angle $\alpha(0°<\alpha<180°)$ from the first state; a first measurement process in which an image processing accompanied with an edge detection process is applied to the first image and a first size related to a first direction orthogonal to the reference direction of the mark is measured; and a second measurement process in which an image processing accompanied with an edge detection process is applied to the second image and a second size related to a second direction rotated by the angle $\alpha$ with respect to the first direction of the mark is measured.

According to this method, in the first state where the object is set to a reference direction, the image processing accompanied with the edge detection process is applied to the first image of the mark imported by the measurement unit and the first size in the first direction orthogonal to the reference direction of the mark is measured. Further, in the second state where at least a part of the mark is rotated by the predetermined angle $\alpha(0°<\alpha<180°)$ from the first state, the image processing accompanied with the edge detection process is applied to the second image of the mark imported by the measurement unit and the second size in the second direction rotated by the angle $\alpha$ with respect to the first direction of the mark is measured. More specifically, for example, because the import of the first image and the second image is substantially performed under the same conditions by the measurement unit according to the mark arrangement on the object or the like and the image processing accompanied with the edge detection process is applied, deterioration of the size measurement accuracy of the mark due to the combination of the image import and the image processing can be prevented.

According to a second aspect of the present invention, there is provided a first transfer characteristic measurement method in which a transfer characteristic related to two different directions of an exposure apparatus that transfers a pattern formed on a mask onto an object is measured, the method comprising: a transfer process in which a mark containing a first element and a second element used to measure the transfer characteristic in the two directions is formed using the exposure apparatus; an image import process in which the object is set to a reference direction within a measurement unit and a first image, which is at least a part of the mark containing one of the first element and the second element, is imported along with a second image, which is at least a part of the mark containing the other element of the first element and the second element whose rotational angle substantially differs from when the first image is imported by an angle $\alpha$ $(0°<\alpha<180°)$ substantially the same as an intersecting angle of the two directions; and a measurement process in which the first image and the second image are processed and a first size and a second size related to the two directions of the mark are respectively measured.

According to this method, a mark that contains the first element and the second element used to measure the transfer characteristics in two directions is formed on the object using the exposure apparatus. Then, the first image, which is at least a part of the mark containing one of the first element and the second element, is imported along with the second image, which is at least a part of the mark containing at least the other element of the first element and the second element whose rotational angle substantially differs from when the first image is imported substantially by the same angle $\alpha$ $(0°<\alpha<180°)$ as an intersecting angle of the two directions. And then, the first image and the second image are each processed, and each of the first size and the second size in the two directions of the mark are measured. More specifically, for example, because the import of the first image and the second image is substantially performed under the same conditions by the measurement unit according to the mark arrangement on the object or the like and the image processing is applied, deterioration of the size measurement accuracy of the mark due to the combination of the image import and the image processing can be prevented, and as a consequence, it becomes possible to accurately measure (evaluate) the transfer characteristics in the two different directions of the exposure apparatus.

According to a third aspect of the present invention, there is provided a second transfer characteristic measurement method in which a pattern transfer characteristic of an exposure apparatus that transfers a pattern formed on a mask onto an object is measured, the method comprising: a first transfer process in which a measurement mask that has a pattern area where at least one predetermined measurement mark is formed is loaded into the exposure apparatus and exposure is performed to transfer the pattern area onto the object; a second transfer process in which the pattern area is transferred onto the object in a state where at least one of the measurement mask and the object is rotated so that an angle of the object with respect to the measurement mask is altered at a predetermined angle $\alpha$ $(0°<\alpha<180°)$ from the first transfer process; an image import process in which an image of a first transferred image of the measurement mark formed on the object in the first transfer process and an image of a second transferred image of the measurement mark formed on the object in the second transfer process are imported by the measurement unit in a state where the object is set to a reference direction; and a measurement process in which an image processing accompanied by an edge detection processing is applied to the image of the first transferred image and the image of the second transferred image that have been imported, and at least a size is measured related to a measurement direction orthogonal to a direction corresponding to the reference direction of each of the first transferred image of the measurement mark and the second transferred image of the measurement mark.

According to this method, exposure is performed by loading the exposure apparatus with the measurement mask that has the pattern area where at least one predetermined measurement mark is formed, and the pattern area is transferred onto the object and the first transferred image of the measurement mark is formed on the object. Further, by rotating at least one of the measurement mask and the object, the pattern area is transferred onto the object in a state where the angle of the object with respect to the measurement mask is altered at the predetermined angle $\alpha$ $(0°<\alpha<180°)$ from the first transfer process, and the second transferred image of the measurement mark is formed on the object. Then, the measurement unit imports the image of the first transferred image of the measurement mark formed on the object and the image of the second transferred image of the measurement mar formed on the object in the state where the object is set to the reference direction. And then, image processing accompanied with the edge detection processing is applied to the first transferred image and the second transferred image that have been imported, and at least the size is measured related to the measurement direction orthogonal to the direction corresponding to the reference direction of each of the first transferred image of the measurement mark and the second transferred image of the measurement mark. More specifically, because the first transferred image and the second transferred image are each formed on the object, for example, so that the image import by the measurement unit is performed under substantially the same conditions, image processing accompanied with the edge detection processing is applied to each of the images of the first transferred image and the second transferred images imported by the measurement unit without rotation, and the size is measured in the measurement direction for each of the first transferred image of the measurement mark and the second transferred image of the measurement mark. Accordingly, deterioration of the size measurement accuracy of the mark due to the combination of the image import and the image processing can be prevented, and as a consequence, it becomes possible to accurately measure (evaluate) the transfer characteristics in the two different directions of the exposure apparatus.

According to a fourth aspect of the present invention, there is provided a third transfer characteristic measurement method in which a transfer characteristic related to a first direction and a second direction that intersect each other of an exposure apparatus that transfers a pattern formed on a mask onto an object is measured, the method comprising: a formation process in which a mark containing a first element whose measurement direction substantially coincide with the first direction and a second element whose measurement direction substantially coincide with the second direction is formed on the object using the exposure apparatus; and a measurement process in which a size related to the measurement direction is measured and the first element and the second element of the mark formed on the object are detected so that the measurement directions are almost in the same direction within a measurement unit.

In this case, 'detection' refers to an overall detection process, which includes the image import, image processing and the like.

According to this method, the mark that contains the first element whose measurement direction substantially coincides with the first direction and the second element whose measurement direction substantially coincides with the second direction is formed on the object using the exposure apparatus. Next, the first element and the second element of the mark formed on the object are detected so that the measurement directions are almost in the same direction within the measurement unit, and the size related to the measurement direction is measured. More specifically, because the size measurement is performed with the measurement direction of the first element and the measurement direction of the second element being made the same by the measurement unit, deterioration of the size measurement accuracy of the mark due to the rotation of the image subject to measurement can be prevented, and as a consequence, it becomes possible to accurately measure (evaluate) the transfer characteristics in the two different directions of the exposure apparatus.

According to a fifth aspect of the present invention, there is provided a fourth transfer characteristic measurement method in which a transfer characteristic related to a first direction and a second direction that intersect each other of an exposure apparatus that transfers a pattern formed on a mask onto an object is measured, the method comprising: a formation process in which a mark containing a first element and a second element whose measurement directions substantially coincide with the first direction and the second direction is formed as a first mark and a second mark whose rotational angle differs at substantially the same angle as an intersecting angle of the first direction and the second direction on the object using the exposure apparatus; and a measurement process in which one of the first element and the second element of the first mark formed on the object and the other of the first element and the second element of the second mark formed on the object whose measurement direction substantially coincides with the one of the first element and the second element of the first mark are detected, and a size of the first element of the mark and a size of the second element of the mark related to the measurement direction are respectively measured.

In this case, 'detection' refers to an overall detection process, which includes the image import, image processing and the like.

According to this method, the mark containing the first element and the second element whose measurement directions substantially coincide with the first direction and the second direction is formed as the first mark and the second mark whose rotational angle differs at substantially the same angle as the intersecting angle of the first direction and the second direction on the object using the exposure apparatus. Then, one of the first element and the second element of the first mark formed on the object and the other one of the first element and the second element of the second mark formed on the object whose measurement direction substantially coincides with the one element of the first mark described above are detected, and the size of the first element and the second element of the mark of the mark related to the measurement direction are measured. More specifically, for example, because the size of the one element of the first mark and the size of the other element of the second mark are each formed on the object so that the measurement unit performs detection under substantially the same conditions, detection processing can be applied without performing any rotation, and the size of the first element and the second element of the mark in the measurement direction are measured. Accordingly, deterioration of the size measurement accuracy of the mark can be prevented, and as a consequence, it becomes possible to accurately measure (evaluate) the transfer characteristics in the two different directions of the exposure apparatus.

According to a sixth aspect of the present invention, there is provided an adjustment method of an exposure apparatus, the method comprising: a measurement process in which a pattern transfer characteristic of the exposure apparatus that transfers a pattern formed on a mask onto an object is measured using the transfer characteristic measurement method in any one of the first to fourth transfer characteristic measurement method; and an adjustment process in which the exposure apparatus is adjusted based on results of the measurement.

According to this method, the transfer characteristics of the pattern by the exposure apparatus is accurately measured (evaluated) using any one of the first to fourth transfer characteristic measurement method of the present invention, and the adjustment of the exposure apparatus is performed based on the measurement results. Accordingly, it becomes possible to adjust the pattern transfer characteristics of the exposure apparatus with good accuracy.

Further, in a lithography process, by transferring a pattern formed on a mask onto a photosensitive object using an exposure apparatus whose pattern transfer characteristics have been adjusted according to the adjustment method of the present invention, highly integrated devices can be manufactured with good yield. According, further from another aspect, it can be said that the present invention is a device manufacturing method in which devices are manufactured using the exposure apparatus that also has been adjusted by the adjustment method of the present invention.

BEST MODE FOR CARRYING OUT THE INVENTION

An embodiment of the present invention will be described below, referring to FIGS. 1 to 7.

Figure 1:
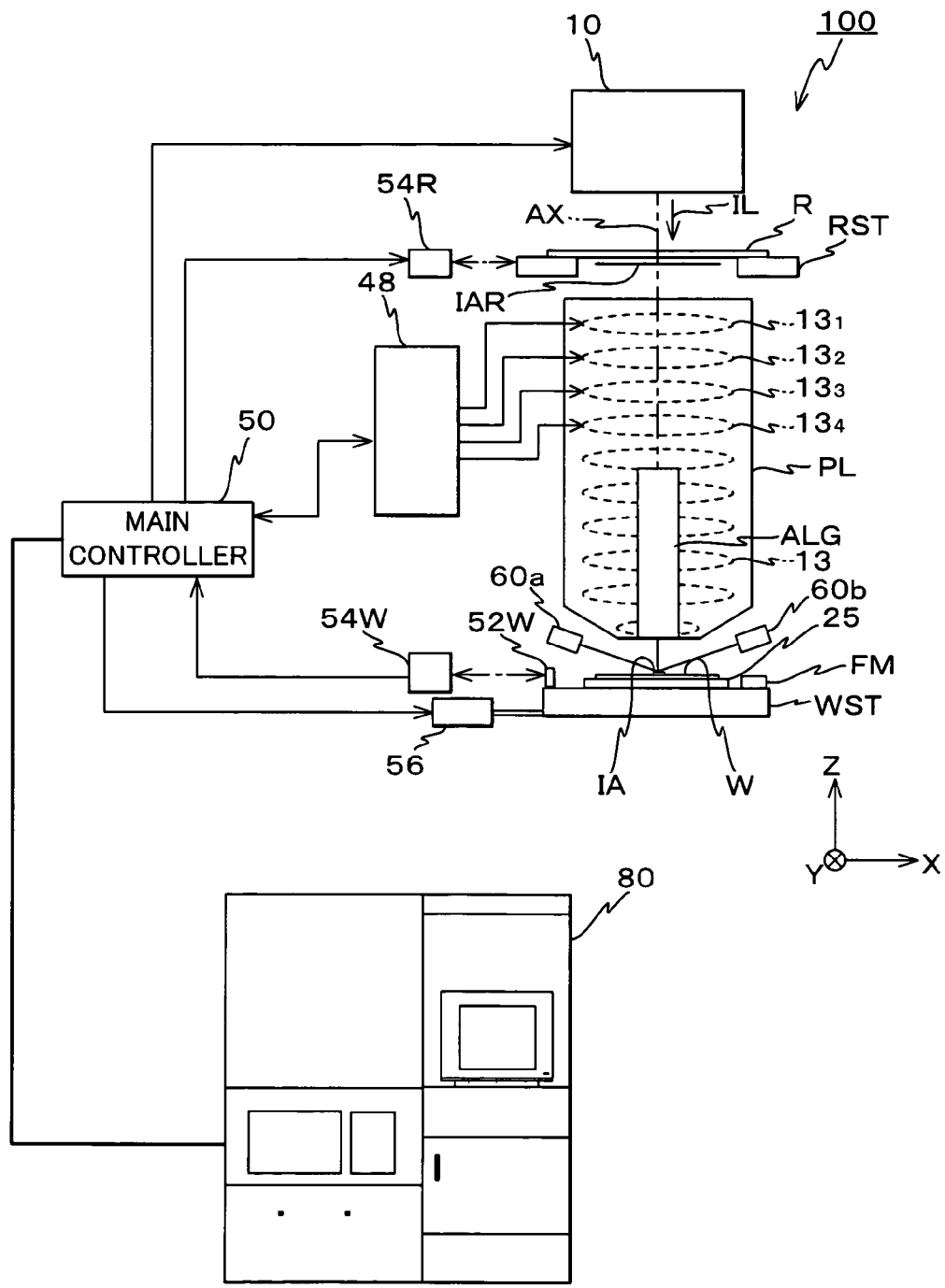
FIG. 1 is a view schematically showing a configuration of an exposure apparatus in an embodiment.

FIG. 1 schematically shows the entire configuration of an exposure apparatus 100 related to the embodiment to which an adjustment method of an exposure apparatus of the present invention is applied. Exposure apparatus 100 is a projection. exposure apparatus (the so-called scanner) by the step-and-scan method.

Exposure apparatus 100 is equipped with an illumination system 10 composed of a light source and an illumination optical system, a reticle stage RST that holds a reticle R serving as a mask which is illuminated by an exposure illumination light (hereinafter simply referred to as 'exposure light') IL serving as an energy beam from illumination system 10, a projection optical system PL that projects illumination light IL emitted from reticle R onto a wafer W (on an image plane) serving as an object, a wafer stage WST that holds wafer W, a control system for controlling these parts and the like.

As is disclosed in, for example, Kokai (Japanese Unexamined Patent Application Publication) No. 2001-313250 and its corresponding U.S. Patent Application Publication No. 2003/0025890 description or the like, illumination system 10 is configured including a light source and an illuminance uniformity optical system, which includes an optical integrator and the like. Illumination system 10 also includes a beam splitter, a relay lens, a variable ND filter, a reticle blind, and the like (all of which are not shown). In illumination system 10, illumination light (exposure light) IL illuminates a slit-shaped illumination area set by the reticle blind on reticle R with a substantially uniform illuminance. In this case, for example, an ArF excimer laser beam (wavelength: 193 nm) is used as illumination light IL. Further, as the optical integrator, a fly-eye lens, a rod integrator (an internal reflection type integrator), a diffractive optical element or the like can be used. As illumination system 10, besides the system described above, a system having the arrangement disclosed in, for example, Kokai (Japanese Unexamined Patent Application Publication) No. 6-349701, and the corresponding U.S. Pat. No. 5,534,970, can also be employed. As long as the national laws in designated states or elected states, to which this international application is applied, permit, the above disclosures of the Kokai publications, the U.S. Patent application publication description, and the U.S. Patent are incorporated herein by reference.

On reticle stage RST, reticle R is mounted and is held by suction via electrostatic chucking (or vacuum chucking) or the like. Reticle stage RST is configured finely drivable (including rotation) within a horizontal plane (an XY plane) by a drive system (not shown). Reticle stage RST is finely drivable (including rotation around a Z-axis) within an XY plane perpendicular to the optical axis of the illumination system (coincides with an optical axis AX of a projection optical system PL that will be described later) by a reticle stage drive section (not shown) that includes a linear motor or the like, and reticle stage RST is also drivable in a predetermined scanning direction (in this case, a Y-axis direction) at a designated scanning speed.

The position of reticle stage RST within the XY plane is constantly detected by a reticle laser interferometer (hereinafter referred to as 'reticle interferometer') 54R via a reflection surface arranged (or formed) on reticle stage RST at a resolution of, for example, around 0.5 to 1 nm. Positional information of reticle stage RST from reticle interferometer 54R is supplied to a main controller 50 installed outside a main body chamber (not shown) that houses the illumination optical system (the components of illumination system 10 excluding the light source), the projection optical system and the like inside. Main controller 50 drives and controls reticle stage RST via the reticle stage drive section (not shown), based on the positional information of reticle stage RST.

Projection optical system PL is, for example, a both-side telecentric reduction system. The projection magnification of projection optical system PL is, for example, one-fourth, one-fifth, one-sixth times or the like. Therefore, when illumination light IL illuminates an illumination area IAR on reticle R as is previously described, a reduced image of the circuit pattern or the like within illumination area IAR of reticle R is formed on an irradiation area (exposure area) IA of illumination light IL on wafer W conjugate with illumination area IAR, via projection optical system PL.

As projection optical system PL, a refraction system that consists only of a plurality of dioptric elements (lens elements) 13, such as around 10 to 20 pieces, is used. Of the plurality of lens elements 13 that make up projection optical system PL, a plurality of (in this case, four lenses in order to simplify the description) lens elements $13_1$, $13_2$, $13_3$, and $13_4$ on the object surface side (reticle R side) are movable lenses that can be moved from the outside by an image forming quality correction controller 48. Lens elements $13_1$ to $13_4$ are each held by the barrel via lens holders that have a double structure (not shown). These lens elements $13_1$ to $13_5$ are each held by inner lens holders, and these inner lens holders are supported by drive elements (not shown) (actuators) such as piezo elements at three points in the gravitational direction with respect to outer lens holders. And, by independently adjusting the applied voltage to the drive elements, each of the lens elements $13_1$ to $13_4$ can be shifted along the Z-axis direction, which is the optical axis direction of projection optical system PL, and can also be driven (tiltable) in a direction of inclination with respect to the XY plane (that is, a rotational direction around the X-axis (θx direction) and a rotational direction around the Y-axis (θy direction)).

The barrel holds lens elements 13 other than the ones referred to above via typical lens holders. Optical elements other than lens elements 13$_1$ to 13$_4$ may be made drivable, such as the lenses disposed in the vicinity of the pupil plane of projection optical system PL, the lenses disposed on the image plane side, an aberration correction plate (optical plate) that corrects the aberration of projection optical system PL, especially the non-rotational symmetric component, or the like. Furthermore, the degree of freedom (the movable direction) of such drivable optical elements is not limited to three, and may be one, two, four or greater than four.

On wafer stage WST, wafer W is held by vacuum chucking (or electrostatic suction) or the like via a wafer holder 25. In the embodiment, as wafer holder 25, a holder as the one disclosed in, for example, Kokai (Japanese Unexamined Patent Application Publication) No. 2002-050560, and the corresponding U.S. Patent Application No. 2003/0020889, which can be rotated within an angular range of around 180 degrees around the Z-axis in a state holding the wafer by a drive unit (not shown) (e.g. a rotary motor) is employed. As long as the national laws in designated states or elected states, to which this international application is applied, permit, the above disclosures of the Kokai publications, the U.S. Patent application publication description, and the U.S. Patent are incorporated herein by reference.

Wafer stage WST is disposed below projection optical system PL, and is movable in the XY planar direction and the Z-axis direction by a wafer stage drive section 56 composed of parts such as a linear motor, a voice coil motor (VCM), and the like. Wafer stage WST is also finely drivable in a direction of inclination (rotational direction around the X-axis (the θx direction) and rotational direction around the Y-axis (the θy direction)) with respect to the XY plane.

The position of wafer stage WST within the XY plane (including rotation around the Z-axis (the θz rotation)) is constantly detected by a wafer laser interferometer (hereinafter simply referred to as 'wafer interferometer') 54 via a reflection surface arranged (or formed) on wafer stage WST, at a resolution, for example, around 0.5 to 1 nm. Wafer interferometer 54W includes a plurality of multi-axis interferometers that have a plurality of measurement axes, and with these interferometers, rotation of wafer stage WST (θz rotation (yawing), a θy rotation, which is rotation around the Y-axis (rolling), and a θx rotation, which is rotation around the X-axis (pitching)) can be measured.

Positional information (or velocity information) on wafer stage WST detected by wafer interferometer 54W is supplied to main controller 50. Main controller 50 controls wafer stage WST via wafer stage drive section 56 based on the positional information (or velocity information) on wafer stage WST referred to above.

Further, on wafer stage WST, a fiducial mark plate FM on which a plurality of pairs of a first fiducial mark used for reticle alignment (to be described later on) and fiducial marks or the like used for baseline measurement of an alignment system ALG (to be described later on) are formed are fixed so that the surface of fiducial mark plate FM is set at substantially the same height as the surface of wafer W.

In exposure apparatus 100 of the embodiment, a multiple point focal position detection system (hereinafter simply referred to as a 'focal position detection system') based on an oblique method that consists of an irradiation system 60*a* and a photodetection system 60*b* is arranged. Irradiation system 60*a* has a light source whose on/off is controlled by main controller 50, and irradiates imaging beams so as to form a large number of images of pinholes or slits toward the imaging plane of projection optical system PL from an oblique direction with respect to optical axis AX, whereas photodetection system 60*b* receives the imaging beams reflected off the surface of wafer W. Incidentally, details on a configuration of a multiple point focal position detection system similar to the focal position detection system (60*a*, 60*b*) of the embodiment are disclosed in, for example, Kokai (Japanese Patent Unexamined Application Publication) No. 6-283403 and the corresponding U.S. Pat. No. 5,448,332 or the like. Incidentally, the multiple point focal position detection system described in the publication or the like above has a function of pre-reading the unevenness (step information) of wafer W by irradiating the imaging beams not only within exposure area IA on wafer W but also on the outside of exposure area IA, however, the multiple point focal position detection system does not have to have such a function (that is, the imaging beams have to be irradiated only within exposure area IA). Further, the shape of the beams irradiated by irradiation system 60*a* can be a parallelogram or any other shapes. As long as the national laws in designated states or elected states, to which this international application is applied, permit, the disclosures of the above publication and the corresponding U.S. Patent are fully incorporated herein by reference.

Main controller 50 executes auto-focus (automatic focusing) and auto-leveling by controlling the Z position of wafer W and the inclination with respect to the XY plane via wafer stage drive section 56 so as to make defocus become zero or within the depth of focus during scanning exposure or the like, based on defocus signals from photodetection system 60*b* such as the S-curve signal.

Furthermore, exposure apparatus 100 is equipped with an alignment system ALG by the off-axis method used for position measurement or the like of alignment marks on wafer W held on wafer stage WST and fiducial marks formed on fiducial mark plate FM. As this alignment system ALG, for example, a sensor of an FIA (Field Image Alignment) system based on an image-processing method is used. This sensor irradiates a broadband detection beam that does not expose the resist on the wafer on a target mark, picks up the image of the target mark formed on the photodetection surface by the reflection light from the target mark and an index with a pick-up device (such as a CCD), and outputs the imaging signals. Incidentally, the sensor is not limited to the FIA system, and it is a matter of course that an alignment sensor that irradiates a coherent detection light on a target mark and detects the scattered light or diffracted light generated from the target mark, or a sensor that detects two diffracted lights (e.g. diffracted lights of the same order) generated from the target mark by making them interfere with each other can be used independently, or appropriately combined.

Furthermore, in exposure apparatus 100 of the embodiment, although it is omitted in the drawings, a pair of reticle alignment systems is arranged above reticle R, each constituted by a TTR (Through The Reticle) alignment optical system. With these systems, the light of the exposure wavelength is used to observe a pair of reticle marks on reticle R and the pair of the first fiducial marks corresponding to the reticle marks on the fiducial mark plate at the same time, via projection optical system PL. In the embodiment, as these reticle alignment systems, systems that have a structure similar to the ones disclosed in, for example, Kokai (Japanese Unexamined Patent Application Publication) No. 7-176468, and the corresponding U.S. Pat. No. 5,646,413 and the like are used. As long as the national laws in designated states (or elected states), to which this international application is applied, permit, the above disclosures of the publication and the corresponding U.S. Patent are incorporated herein by reference.

The control system in FIG. 1 is mainly composed of main controller 50. Main controller 50 is constituted by a so-called workstation (or microcomputer) made up of a CPU (Central Processing Unit), ROM (Read Only Memory), RAM (Random Access Memory), and the like, and besides the various control operations described above, main controller 50 controls the overall operation of the entire apparatus.

Incidentally, exposure apparatus 100 of the embodiment connects in-line to a coater developer (not shown) (hereinafter referred to as a 'C/D'). The C/D is configured including a coater (resist coating) section for coating a resist on a wafer, a developer (development) section for developing a wafer that has been exposed, a coating controller and a development controller. The coating controller controls the resist coating operation to the wafer and the development controller controls the development operation of the wafer.

Further, main controller 50 of exposure apparatus 100 connects to an SEM system 80 configured including a length measuring SEM, which is a type of a measurement unit by a charged particle beam scan, via a communication path. To describe briefly this SEM system 80, in the system, for example, a pattern size is measured by irradiating a primary beam converged by an electromagnetic lens on a length measuring pattern within an electron beam barrel maintained at $10^{-5}$ Pa or larger, trapping secondary electrons and reflection electrons emitted from the irradiation surface, and detecting a pattern edge of the length measuring pattern from a line profile.

SEM system 80 is configured, for example, including parts such as: a) an SEM section, b) an SEM control system for integrating a TFE (Thermal Field Emission) high-voltage power supply, a focusing lens and an objective lens power supply, a deflection power supply for scanning, a Z sensor control system, and a secondary electron detector, c) a stage control system having a wafer carrier and a laser interferometer that controls a high-speed stage drive, d) a signal converter that synchronizes a secondary electron signal and a deflection signal and transfers them to the imaging signals, e) an image processing system (including a display unit), f) a main computer that has overall control over the entire system and the like.

In the embodiment, the main computer of SEM system 80 connects to main controller 50 of exposure apparatus 100 via the communication path.

Figure 2:
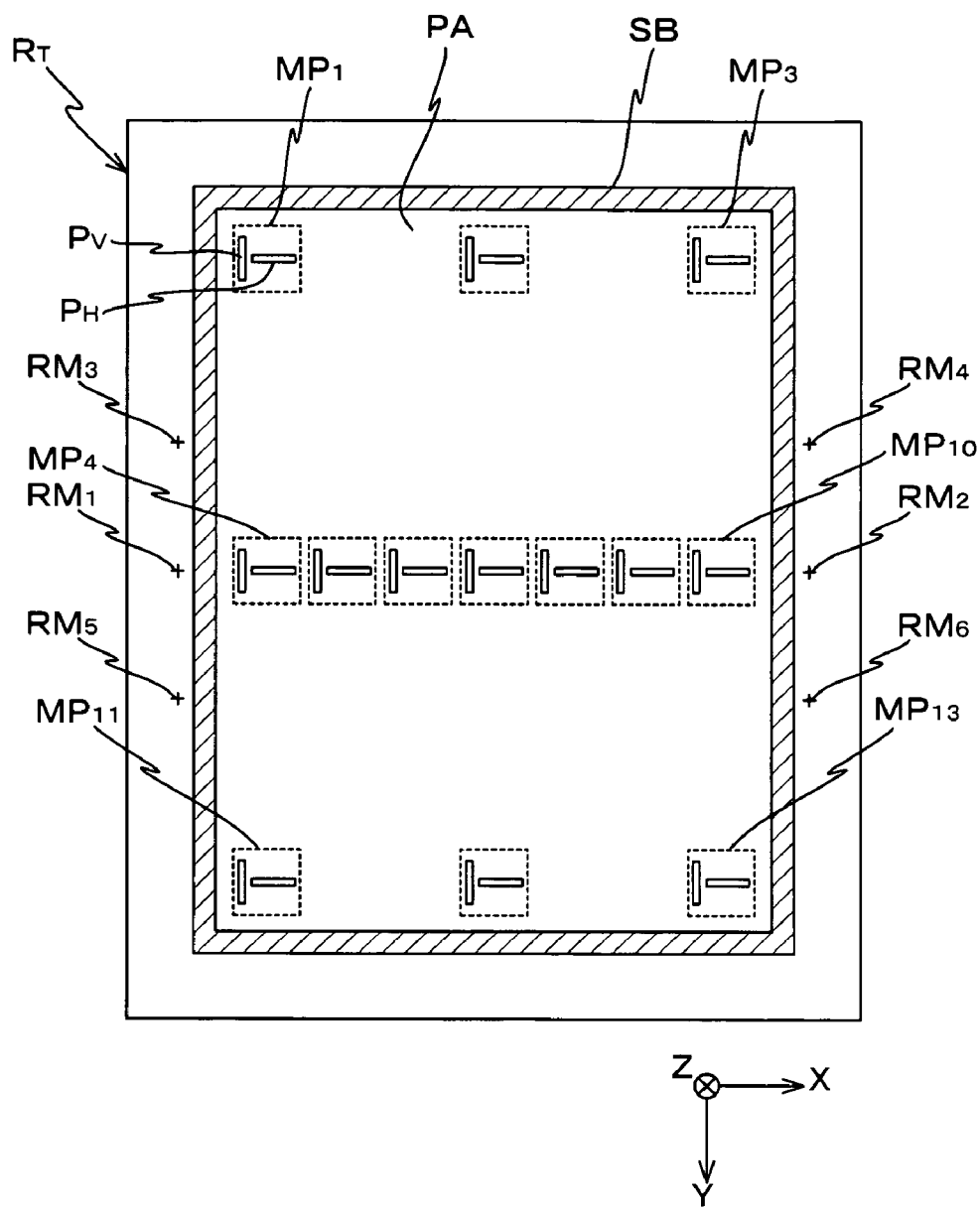
FIG. 2 is a planar view showing a measurement reticle from a pattern surface side.

Next, a measurement reticle $R_T$, which serves as a measurement mask on which a measurement mark whose image (such as the resist image) is subject to line width measurement in the adjustment method of the embodiment is formed, will be described referring to FIG. 2. FIG. 2 is a planar view of measurement reticle $R_T$ when viewed from the pattern surface side. As is shown in FIG. 2, measurement reticle $R_T$ is made of a rectangular glass substrate, and in the center section of the pattern surface a rectangular shaped pattern area PA is formed surrounded by a shading band SB. Within pattern area PA, a total of 13 measurement marks, from measurement mark $MP_1$ up to measurement mark $MP_{13}$, are formed. These measurement marks are disposed in three rows in the Y-axis direction, and the middle row has seven measurement marks, $MP_4$ to $MP_{10}$, disposed equally spaced apart. The other rows have three measurement marks each; measurement marks $MP_1$ to $MP_3$ and measurement marks $MP_{11}$ to $MP_{13}$, also disposed equally spaced apart.

As is shown in FIG. 2, each measurement mark $MP_j$ (j=1 to 13) includes a first line pattern element (or a first mark element, hereinafter also referred to as a 'vertical line pattern element') $P_V$ whose design line width extending in the Y-axis direction on measurement reticle $R_T$ is, for example, 400 nm, and a second line pattern element (or a second mark element, hereinafter also referred to as a 'horizontal line pattern element') $P_H$ whose design line width extending in the X-axis direction, which is a direction rotated clockwise in FIG. 2 at an angle α (α in this case is 90 degrees (or 270 degrees)) with respect to the Y-axis direction, is, for example, 400 nm. In the case the first line pattern element $P_V$ and the second line pattern element $P_H$ are transferred onto a wafer when the projection magnification of projection optical system PL is ¼, in an ideal state where there are no aberrations such as spherical aberration, astigmatism or the like, a line pattern image with a line width of 100 nm can be obtained as the images of the first line pattern element $P_V$ and the second line pattern element $P_H$.

Further, on both the outer sides of pattern area PA on the X-axis that passes through the center of pattern area PA (coincides with the reticle center), reticle alignment marks $RM_1$ and $RM_2$ are formed. On one side and the other side of the Y-axis direction spaced equally apart with reticle alignment mark $RM_1$ in the center, reticle alignment marks $RM_3$ and $RM_5$ are respectively formed. Further, on one side and the other side of the Y-axis direction spaced equally apart with reticle alignment mark $RM_2$ in the center, reticle alignment marks $RM_4$ and $RM_6$ are respectively formed. Reticle alignment marks $RM_3$ and $RM_5$ and reticle alignment marks $RM_4$ and $RM_6$ are disposed symmetrical to the Y-axis that passes the reticle center. In a state where measurement reticle $R_T$ is loaded on reticle stage RST, the pattern surface (the surface close to the page surface in FIG. 2) is the surface on the side that faces projection optical system PL.

Next, of the adjustment methods of the exposure apparatus related to this embodiment, operations controlled by main controller 50 of exposure apparatus 100, that is, the operations performed in exposure apparatus 100 and in the C/D in-line connected to exposure apparatus 100 will be described along flow charts in FIGS. 3 and 4 that show a simplified processing algorithm of the CPU in main controller 50 and also referring to other drawings appropriately.

As a premise of these operations, the reticle is not mounted on reticle stage RST, and the wafer is not mounted on wafer stage WST.

Figure 3:
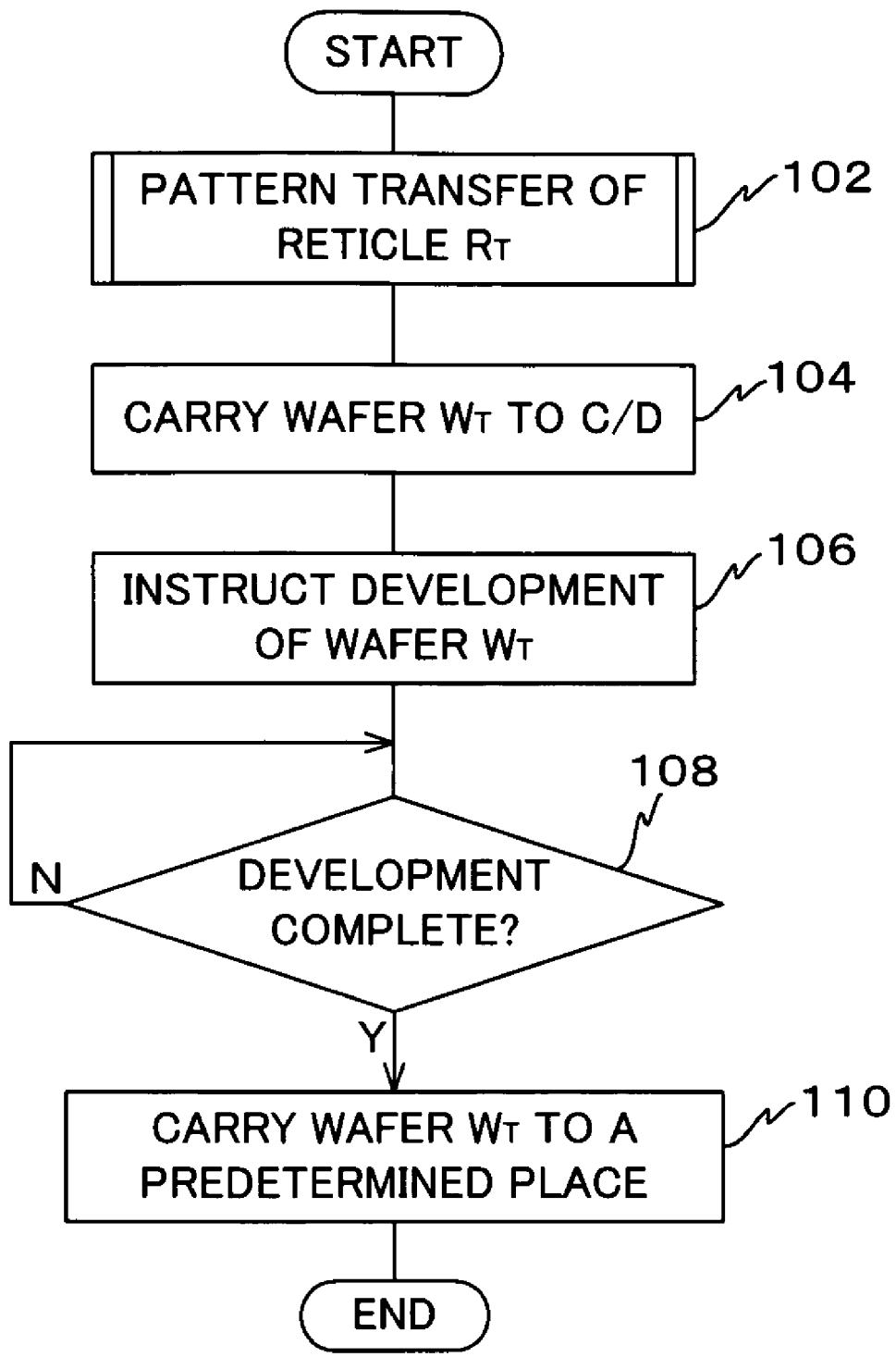
FIG. 3 is a flowchart briefly showing a processing algorithm of a CPU within a main controller of an exposure apparatus when processing of a pattern transfer characteristic measurement method of the exposure apparatus is partially performed.
Figure 4:
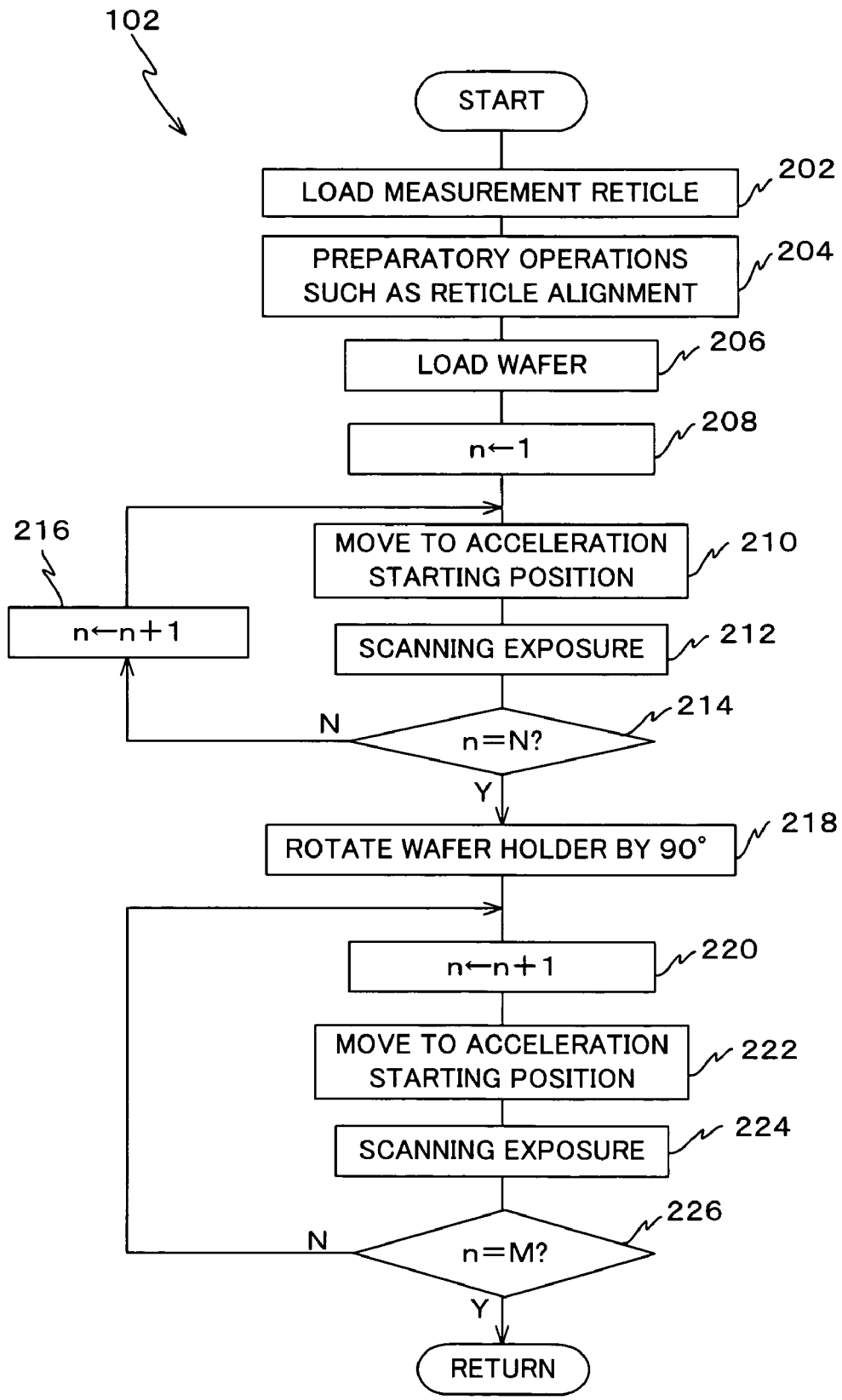
FIG. 4 is a view showing an example of a subroutine of step 102 in FIG. 3.

In step 102 in FIG. 3, a processing of a subroutine is performed for pattern transfer of measurement reticle $R_T$. In this subroutine, first of all, in step 202 in FIG. 4, measurement reticle $R_T$ is loaded onto reticle stage RST via a reticle loader (not shown).

Next, in step 204, predetermined preparatory operations such as reticle alignment and the like are performed. To be more specific, wafer stage WST is moved to a reference position where the center of a specific pair of the first fiducial marks formed on the surface of fiducial mark plate FM arranged on wafer stage WST substantially coincides with optical axis AX of projection optical system PL, and reticle stage RST is moved to a reference position where the center (reticle center) of a pair of reticle alignment marks $RM_1$ and $RM_2$ on measurement reticle $R_T$ substantially coincides with the optical axis of projection optical system PL. In this case, main controller 50 performs the movement of wafer stage WST by controlling wafer stage drive section 56 while monitoring the measurement values of wafer interferometer 54W, and also performs the movement of reticle stage RST by controlling the reticle stage drive section (not shown) while monitoring the measurement values of reticle interferometer 54R. The description below is no different.

Next, the relative position of the specific pair of the first fiducial marks on fiducial mark plate FM and the projected image of the corresponding reticle alignment marks $RM_1$ and $RM_2$ on measurement reticle $R_T$ is detected with the pair of reticle alignment systems previously described using illumination light IL. Then, reticle stage RST and wafer stage WST are moved stepping in opposite ways in the Y-axis direction, and the relative position of a different pair of the first fiducial marks on fiducial mark plate FM and the projected image of the corresponding reticle alignment marks $RM_3$ and $RM_4$ on measurement reticle $R_T$ is detected with the pair of reticle alignment systems previously described using illumination light IL.

That is, by measuring the relative position of at least two pairs of the first fiducial marks on fiducial mark plate FM and the corresponding reticle alignment marks on measurement reticle $R_T$ using the reticle alignment system while performing stepping operations of reticle stage RST and wafer stage WST in the Y-axis direction in the manner described above, detection of the positional relation between a wafer stage coordinate system set by the measurement axes of the wafer interferometer and a reticle stage coordinate system set by the measurement axes of the reticle interferometer, or in other words, reticle alignment is performed. Incidentally, in the reticle alignment, wafer stage WST does not have to be moved, as long as reticle stage RST is moved.

Further, the width of the opening of a movable reticle blind within illumination system 10 in a non-scanning direction is adjusted so that the width of the irradiation area (illumination area IAR) of illumination light IL in the non-scanning direction substantially coincides with the width of pattern area PA of measurement reticle $R_T$ in the non-scanning direction.

Figure 5A:
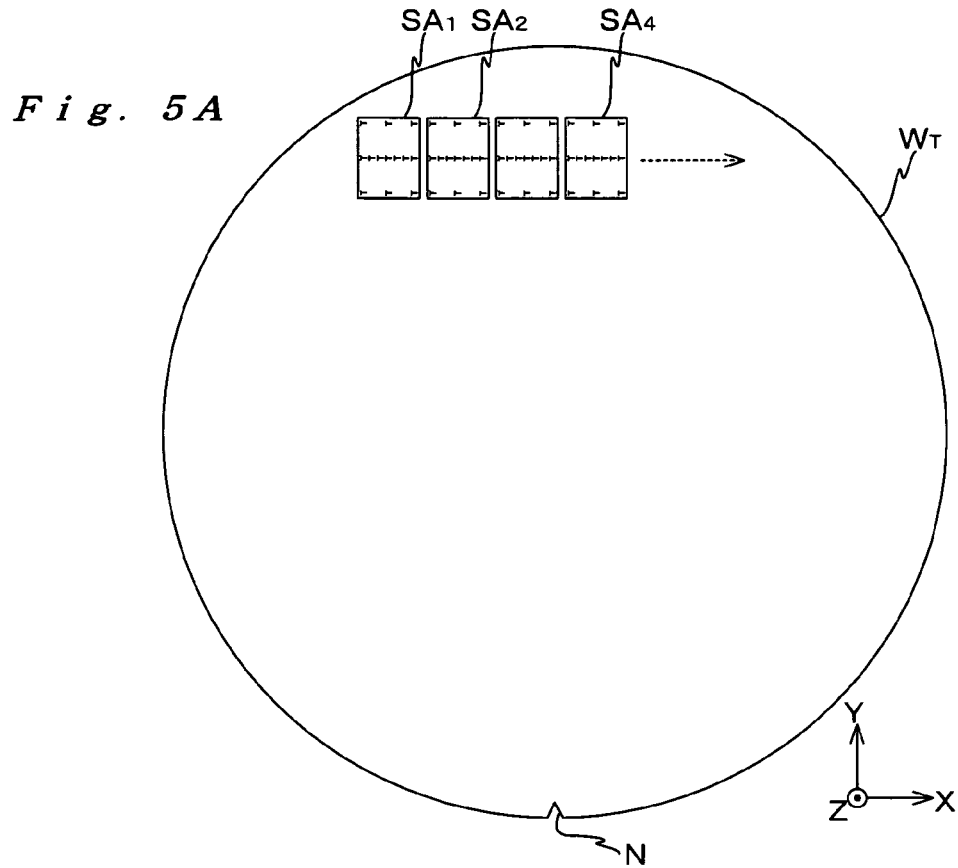
FIG. 5A is a view showing a state of a measurement wafer $W_T$ where pattern transfer processing has been completed on a fourth shot.

When the predetermined preparatory operations are completed in the manner described above, the processing then moves to the next step, step 206 where a wafer $W_T$ for measurement (hereinafter also referred to as a 'measurement wafer') is loaded from the C/D previously described via a wafer loader (not shown) onto wafer stage WST. In this case, for example, as is shown in FIG. 5A, measurement wafer $W_T$ whose surface is coated with a resist is to be mounted on wafer stage WST via wafer holder 25, in a state where a notch N formed partially on a periphery portion of measurement wafer $W_T$ faces a -Y direction (hereinafter also referred to as a '0 degrees state').

In the next step, step 208, a count value n of a counter (not shown), which indicates that it is the $n^{th}$ exposure to measurement wafer $W_T$, is initialized to '1'.

In the next step, step 210, wafer stage WST is moved to an acceleration starting position for the $n^{th}$ (in this case, the first) exposure, and reticle stage RST is moved so that the position of measurement reticle $R_T$ is at the acceleration starting position.

In the next step, step 212, relative scanning of reticle stage RST and wafer stage WST related to the Y-axis direction begins. And when both stages reach their target scanning speed and reach a constant speed synchronous state, illumination light IL from illumination system 10 begins to illuminate pattern area PA of measurement reticle $R_T$, and scanning exposure begins. Then, different areas of pattern area PA of measurement reticle $R_T$ are sequentially illuminated with illumination light IL and scanning exposure ends when illumination with respect to the entire surface of the pattern area is completed. Accordingly, pattern area PA formed on measurement reticle $R_T$ is reduced and transferred onto areas subject to exposure on measurement wafer $W_T$, via projection optical system PL.

In the next step, step 214, referring to count value n of the counter previously described, the judgment of whether or not n equals K (n=K) or not, that is, whether the exposure for forming K transferred images of the pattern area on wafer $W_T$ that should be performed has been completed or not. In this case, since n equals 1 (n=1), or more specifically, only one transferred image of pattern area PA (i.e. in this example, 13 measurement marks $MP_j$) has been formed on wafer $W_T$ by the first exposure, the judgment in step 214 is negative; therefore, the procedure moves to step 216.

Next, in step 216, count value n of the counter previously described is incremented by 1 (n←n+1), and then the procedure returns to step 210.

Hereinafter, until the judgment in step 214 is affirmed, a loop processing (including judgment) of steps 210→212→214→216 is repeated. Incidentally, FIG. 5A shows the state of measurement wafer $W_T$ when step 212 has been completed, when n=4.

Figure 5B:
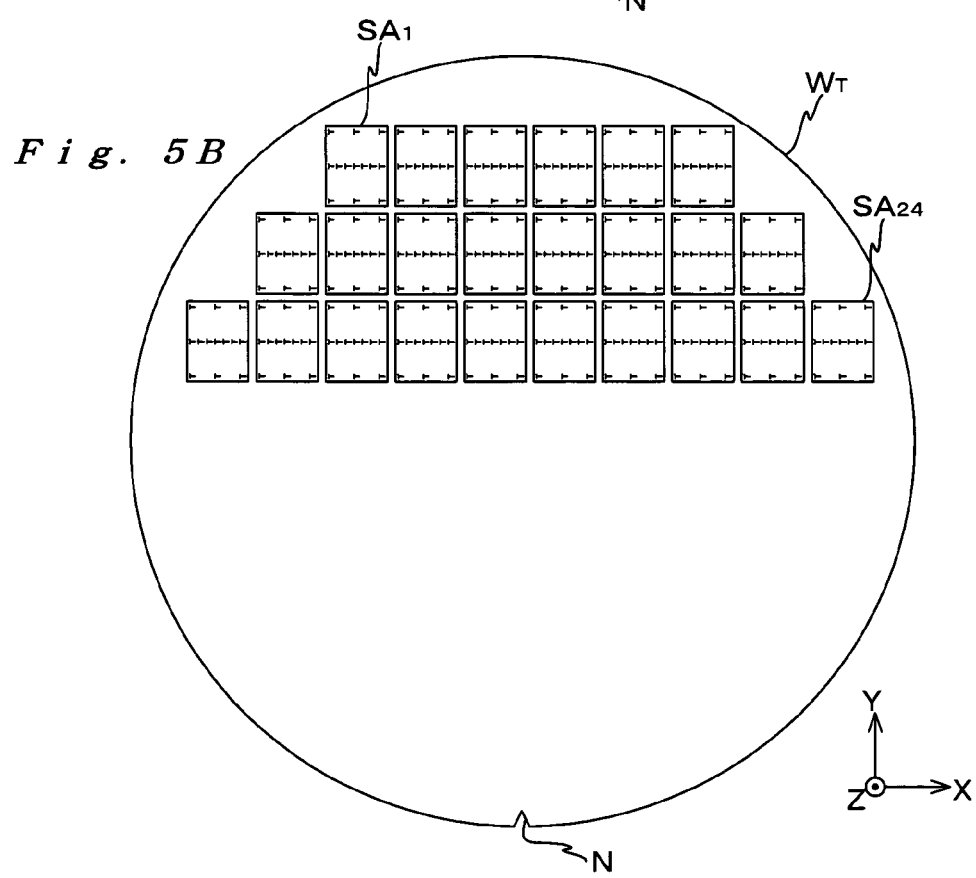
FIG. 5B is a view showing a state of measurement wafer $W_T$ where pattern transfer processing has been completed on a twenty-fourth shot.

Then, when K (in this case, K=24) transferred images of pattern area PA (i.e. in this example, 13 measurement marks $MP_j$) that should be formed are formed on measurement wafer $W_T$ by the $K^{th}$ scanning exposure, the procedure then moves to step 218. Incidentally, FIG. 5B shows the state of measurement wafer $W_T$ just before the processing in step 218 begins. Further, in FIGS. 5A and 5B, the irradiation range (a formation area of the transferred image of pattern area PA) of illumination light IL on wafer $W_T$ in one scanning exposure is indicated as shot area $SA_n$, and in the embodiment, the transferred image of pattern area PA is formed in each of the 24 different shot areas (e.g. field size of 26×33 mm) separately set on wafer $W_T$.

Figure 6A:
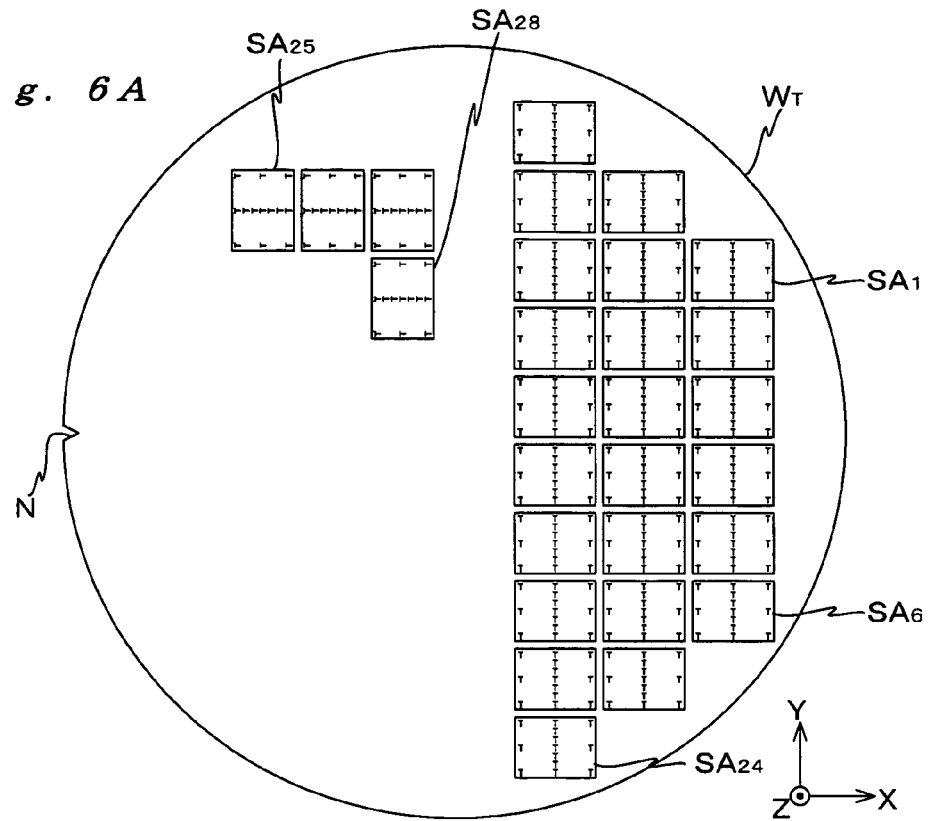
FIG. 6A is a view showing a state of measurement wafer $W_T$ where pattern transfer processing has been completed on a twenty-eighth shot.

In step 218, wafer holder 25 is rotated and driven around the Z-axis at an angle of 90 degrees (e.g. 90 degrees clockwise) in a state holding measurement wafer $W_T$ via a drive unit (not shown) (e.g. a rotary motor). Accordingly, measurement wafer $W_T$ is set to a state where notch N faces the -X direction (hereinafter also referred to as a '90 degrees state'), as is shown in FIG. 6A.

Next, in step 220, count value n is incremented by 1 (n←n+1), and then the procedure moves to step 220.

In step 222, wafer stage WST is moved to the acceleration starting position for the $n^{th}$ exposure (in this case, exposure for forming the $25^{th}$ shot area $SA_{25}$ (the $25^{th}$ transferred image of pattern area PA)), and reticle stage RST is moved so that the position of measurement reticle $R_T$ is at the acceleration starting position.

In the next step, step 224, scanning exposure is performed as in step 212 previously described, and the transferred image of pattern area PA of measurement reticle $R_T$ is formed on wafer $W_T$. In this case, the transferred image of pattern PA is formed in shot area $SA_{25}$ shown in FIG. 6A. Shot are $SA_{25}$ is a shot area rotated by 90 degrees with respect to shot areas $SA_1$ to $SA_{24}$, which are formed earlier.

In the next step, step 226, referring to counter n, the judgment of whether or not n equals M (n=M) or not, that is, whether the exposure of all shot areas M (in this case, M=48) that should be performed has been completed or not. In this case, since n equals 25 (n=25), the judgment in step 226 is negative; therefore, the procedure returns to step 220.

Then, until the judgment in step 226 is affirmed, a loop processing (including judgment) of steps 220→222→224→226 is repeated. Incidentally, FIG. 6A shows the state of measurement wafer $W_T$ when step 224 has been completed, when n=28.

Figure 6B:
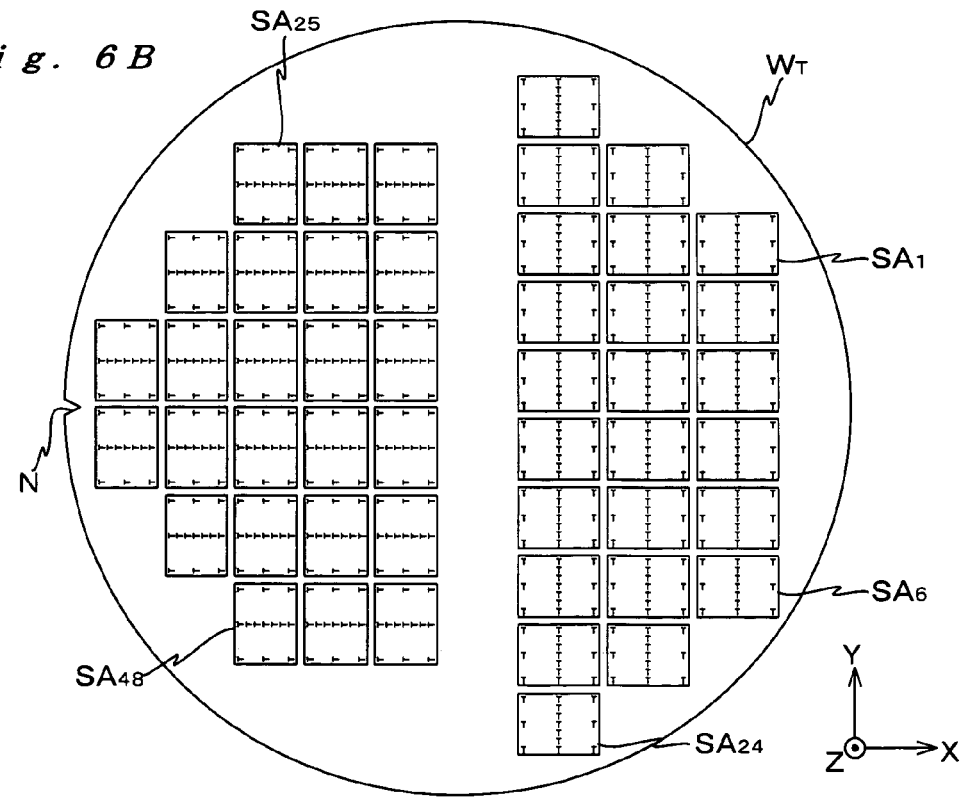
FIG. 6B is a view showing a state of measurement wafer $W_T$ where pattern transfer processing has been completed on all forty-eight shots.

Then, when pattern area PA has been transferred on all the number of shots M (=48) that should be transferred on measurement wafer $W_T$, the processing in this subroutine is completed, and the procedure returns to step 104 in the main routine in FIG. 3. Incidentally, FIG. 6B shows the state of measurement wafer $W_T$ when all the subroutine processing of pattern transfer of measurement reticle $R_T$ in step 102 has been completed. In this state, on the right and left side areas with the wafer center in between, shot areas whose longitudinal direction differs at an angle of 90 are formed, 24 on each side.

Referring back to FIG. 3, in the next step, step 104, measurement wafer $W_T$ that has undergone exposure processing in the subroutine in step 102 described above is carried to the C/D, which is in-line connected to exposure apparatus 100. In this case, measurement wafer $W_T$ is unloaded from wafer stage WST via a wafer unloader, and is carried into the C/D via a wafer carrier system.

In the next step, step 106, instructions for development processing of measurement wafer $W_T$ are given to the development controller that controls the developer section which constitutes the C/D. After the instructions are given, the procedure then moves to step 108 where it waits for measurement wafer $W_T$ to be developed.

Figure 7:
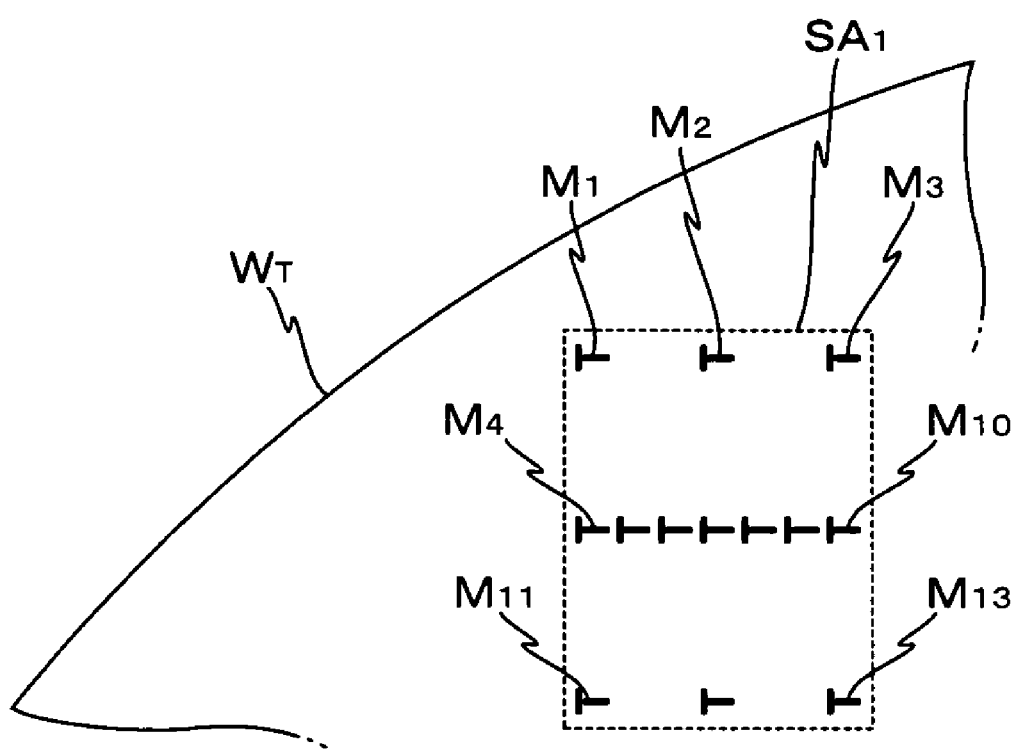
FIG. 7 is a view showing resist images $M_1$ to $M_{13}$ of measurement marks $MP_1$ to $MP_{13}$ formed in a shot area $SA_1$ on measurement wafer $W_T$.
Figure 7:
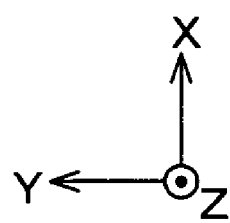

During this waiting time, on the C/D side, measurement wafer $W_T$ is developed and when the development is completed, pattern area PA is formed on measurement wafer $W_T$, in each of the shot areas $SA_1$ to $SA_{48}$ shown in FIG. 6B. In this case, in shot area $SA_1$, resist images $M_1$ to $M_{13}$ (hereinafter also referred to as 'mark $M_j$' for the sake of convenience) of the 13 measurement marks $MP_1$ to $MP_{13}$ are formed as is shown in FIG. 7. This is the same for other shot areas $SA_2$ to $SA_{48}$. Measurement wafer $W_T$ on which such resist images (marks) $M_j$ are formed will be a sample for measuring the pattern transfer characteristics of exposure apparatus 100.

When the development has been completed and the completion is confirmed by receiving the notice from the development controller, the procedure then moves to step 110 where measurement wafer $W_T$ that has been developed is carried to a predetermined location in the vicinity of SEM system 80 via the wafer carrier system (not shown), and the series of processing in the main routine is completed. In this case, the predetermined location is a place where an operator can easily take out the wafer that has been developed and a place also suitable for delivering the wafer that has been taken out into the wafer carrier system on the atmospheric side of SEM system 80, and refers to a location that is determined in advance.

Then, the operator takes out measurement wafer $W_T$ that has been developed from the predetermined location described above, and delivers the wafer to the wafer carrier system on the atmospheric side of SEM system 80.

Then, according to instructions from the operator, SEM system 80 performs size measurement of the pattern in the resist images using measurement wafer $W_T$ as a sample in a similar procedure as in a normal measurement.

In this case, according to the instructions from the operator, measurement wafer $W_T$ is delivered into a sample chamber sequentially going through a carrier system on the atmospheric side, a load lock chamber, and a carrier system on a vacuum side that constitutes SEM system 80. Within the sample chamber, measurement wafer $W_T$ faces a zero degree direction (this direction is to be a reference direction). The reference direction in this case refers to the direction of measurement wafer $W_T$ when both the longitudinal direction of shot areas $SA_1$ to $SA_{24}$ and the direction orthogonal to the longitudinal direction (coincides with the longitudinal direction of shot areas $SA_{25}$ to $SA_{48}$) coincide with the coordinate axes of an orthogonal coordinate system (an XY coordinate system) serving as a stage movement coordinate within the sample chamber of SEM system 80, and in this case, the line that connects the center of measurement wafer $W_T$ and notch N is to coincide with the Y-axis.

At this point, the operator instructs SEM system 80 to measure the size related to a measurement direction orthogonal to the reference direction of all the marks $M_1$ to $M_{13}$ within all the shot areas $SA_1$ to $SA_{48}$ on measurement wafer $W_T$ in the zero degree direction. In this case, the measurement direction corresponds to the Y-axis direction in FIG. 6B.

Further, the size of the marks (resist images) related to the measurement direction in this case, for marks $M_1$ to $M_{13}$ within shot areas $SA_1$ to $SA_{24}$, is the line width of the images of the first line pattern element (vertical line pattern element) $P_V$ of measurement marks $MP_1$ to $MP_{13}$ previously described, and for marks $M_1$ to $M_{13}$ within shot areas $SA_{25}$ to $SA_{48}$, the size of the marks related to the measurement direction is the line width of the images of the second line pattern element (horizontal line pattern element) $P_H$ of measurement marks $MP_1$ to $MP_{13}$ previously described.

Therefore, according to the instructions from the operator above, SEM system 80 imports the images (SEM images) of all the marks $M_1$ to $M_{13}$ within all the shot areas $SA_1$ to $SA_{48}$ on measurement wafer $W_T$. Incidentally, the whole image of the resist images of the thirteen marks in each of the 48 shot areas does not have to be imported, and for example, the image that is imported may be only of the image of vertical line pattern element $P_V$ per each mark in shot areas $SA_1$ to $SA_{24}$ and the image of horizontal line pattern element $P_H$ per each mark in shot areas $SA_{25}$ to $SA_{48}$.

Next, the image processing system of SEM system 80 performs image processing accompanied by an edge detection processing on each of the images of all the marks $M_1$ to $M_{13}$ within all the shot areas $SA_1$ to $SA_{48}$ on measurement wafer $W_T$. And, as for marks $M_1$ to $M_{13}$ within shot areas $SA_1$ to $SA_{24}$, the line width of an image (a first element, a first section, a first line element) of the first line pattern element (vertical line pattern element) $P_V$ previously described is measured, whereas for marks $M_1$ to $M_{13}$ within shot areas $SA_{25}$ to $SA_{48}$, the line width of an image (a second element, a second section, a second line element) of the second line pattern element (horizontal line pattern element) $P_H$ previously described is measured. The measurement results are stored in the internal memory of the main computer of SEM system 80, and are also shown on the screen of the display unit.

On the screen of the display unit, measurement values (hereinafter noted as 'line width values') of 24×13=312 line widths of the images of the first line pattern element (vertical line pattern element) $P_V$ and line width values of 312 line widths of the images of the second line pattern element (horizontal line pattern element) $P_H$ are shown all at once, or by switching the screen.

Then, the operator looks at the display screen of the measurement results by SEM system 80, and then instructs the main computer of SEM system 80 to perform necessary calculation processing, such as computing an average value AVE $(LW_V)_j$ (j=1 to 13), which is the average value of a line width value $LW_V$ of the image of the first line pattern element $P_V$ of each of the marks Mj (j=1 to 13) in the 24 shots, the difference $\Delta AVE(LW_V)$ between the maximum value and the minimum value of $AVE(LW_V)_j$ (j=1 to 13) and the like. Similarly, the operator looks at the display screen of the measurement results by SEM system 80, and then instructs the main computer of SEM system 80 to perform necessary calculation processing, such as computing an average value AVE $(LW_H)_j$ (j=1 to 13), which is the average value of a line width value $LW_H$ of the image of the second line pattern element $P_H$ of each of the marks Mj (j=1 to 13) in the 24 shots, a difference ΔAVE($LW_H$) between the maximum value and the minimum value of AVE($LW_H$)$_j$(j=1 to 13) and the like. Furthermore, the operator instructs the main computer of SEM system 80 to compute a difference Δ($LW_{V-H}$)$_j$(j=1 to 13), which is the difference between average value AVE($LW_V$)$_j$ and average value AVE($LW_H$)$_j$ described earlier.

In this case, Δ($LW_{V-H}$)$_j$ is the difference (V/H difference) between the images of the first line pattern element $P_V$ and the second line pattern element $P_H$ in mark $M_j$, that is, the line width variation (size variation), and ΔAVE($LW_V$) and ΔAVE ($LW_H$) are index values of in-surface uniformity of the line width (size) of the images of the first line pattern element and the second line pattern element.

According to the instructions from the operator above, the main computer of SEM system 80 computes AVE($LW_V$)$_j$(j=1 to 13), ΔAVE ($LW_V$), AVE ($LW_H$)$_j$(j=1 to 13), ΔAVE ($LW_H$) and Δ($LW_{V-H}$)$_j$(j=1 to 13), and these computation results re shown on the screen of the display unit. When the measurement results are shown, the operator looks at the display screen and then instructs the main computer of SEM system 80 to send information on the measurement results to main controller 50 of exposure apparatus 100. Accordingly, the main computer of SEM system 80 sends the information on the measurement results to exposure apparatus 100, and main controller 50 of exposure apparatus 100 receives the information on the measurement results described above and stores the information in memory.

In the embodiment, when transferring a device pattern, after preparatory operations such as reticle alignment and baseline measurement of alignment system ASG have been performed, the device pattern formed on reticle R is transferred onto a plurality of shot areas on wafer W via projection optical system PL by the step-and-scan method. Since such series of operations are the same as in a typical scanner, a detailed description will be omitted.

However, main controller 50 of exposure apparatus 100 performs a calculation according to a predetermined calculation program based on, for example, at least one information exceeding its corresponding permissible range, of the information on the measurement results of AVE($LW_V$)$_j$(j=1 to 13), ΔAVE($LW_V$), AVE($LW_H$)$_j$(j=1 to 13), ΔAVE($LW_H$) and Δ($LW_{V-H}$)$_j$(j=1 to 13) stored earlier in the memory, and based on the calculation results, main controller 50 drives at least one of lenses $13_1$ to $13_4$ that constitutes projection optical system PL via image forming quality correction controller 48 and adjusts the image-forming characteristics of projection optical system PL. Further, during scanning exposure, the speed ratio of wafer stage WST and reticle stage RST is finely adjusted when necessary. By such an adjustment, exposure apparatus 100 adjusts the transfer characteristic of the pattern to a level that satisfies the required specification. More specifically, an adjustment of an exposure apparatus is performed in which each line width of the vertical and horizontal lines, the line width difference Δ($LW_{V-H}$)$_j$=AVE($LW_V$)$_j$-AVE ($LW_H$)$_j$ of the vertical and horizontal lines, the uniformity of each line width of the vertical and horizontal lines within the plane and the like at different positions (the forming positions corresponding to each of the marks $M_1$ to $M_{13}$) within the exposure field (the range on wafer $W_T$ covered in one scanning exposure, corresponds to shot area $SA_n$ previously described) are adjusted so as to satisfy all the specifications.

As is described in detail above, according to the pattern transfer characteristic measurement method of the exposure apparatus related to the embodiment, measurement reticle $R_T$ is loaded into exposure apparatus 100 and exposure is performed (refer to step 212 in FIG. 4), and when pattern area PA formed on measurement reticle $R_T$ is transferred onto measurement wafer $W_T$, the images of a first transferred image (marks $M_1$ to $M_{13}$ of shot areas $SA_1$ to $SA_{24}$ in FIG. 6B) of measurement marks $MP_1$ to $MP_{13}$ formed on measurement wafer $W_T$ are imported by SEM system 80. Further, exposure is performed in a state (refer to step 224) where the angle of wafer $W_T$ with respect to measurement reticle $R_T$ is altered by a predetermined angle of 90 degrees from the point where the first transferred image described above is formed, and the images of a second transferred image (marks $M_1$ to $M_{13}$ of shot areas $SA_{25}$ to $SA_{48}$ in FIG. 6B) of measurement marks $MP_1$ to $MP_{13}$ formed on measurement wafer $W_T$ are imported by SEM system 80. Then, SEM system 80 performs image processing accompanied by an edge detection processing on each of the images of the first transferred image and the second transferred image that have been imported, and the size related to the measurement direction (the Y direction in FIG. 6B) orthogonal to the reference direction of the first transferred image and the second transferred image of the measurement marks, or to be more specific, the line width of an image (a first element, a first section, a first line element) of the first line pattern element (vertical line pattern element) $P_V$ previously described is measured for marks $M_1$ to $M_{13}$ within shot areas $SA_1$ to $SA_{24}$, whereas the line width of an image (a second element, a second section, a second line element) of the second line pattern element (horizontal line pattern element) PH previously described is measured for marks $M_1$ to $M_{13}$ within shot areas $SA_{25}$ to $SA_{48}$.

More specifically, according to the embodiment, the first transferred image and the second transferred image of the measurement marks are each formed, for example, on wafer $W_T$ so that the image import by SEM system 80 is performed under substantially the same conditions. Therefore, the image processing accompanied by the edge detection processing is performed on the images of the first transferred image and the second transferred image without applying rotation to the images, and the size of each of the transferred images of the first transferred image and the second transferred image in the measurement direction is measured. Then, as a consequence, deterioration in the size measurement accuracy of the images of the measurement marks due to the combination of the image import and the image processing can be prevented, which consequently makes it possible to accurately measure (evaluate) the pattern transfer characteristic of exposure apparatus 100.

Further, in the embodiment, according to instructions from the operator, SEM system 80 computes the average value AVE($LW_V$)$_j$(j=1 to 13) of line width value $LW_V$ of the image of the first line pattern element $P_V$ of each of the marks Mj (j=1 to 13) in the 24 shots, the difference ΔAVE($LW_V$) between the maximum value and the minimum value of AVE($LW_V$)$_j$(j=1 to 13) and the like, the average value AVE($LW_H$)$_j$(j=1 to 13) of line width value $LW_H$ of the image of the second line pattern element $P_H$ of each of the marks Mj (j=1 to 13) in the 24 shots, the difference ΔAVE ($LW_H$) between the maximum value and the minimum value of AVE ($LW_H$)$_j$(j=1 to 13), the difference (V/H difference) Δ($LW_{V-H}$)$_j$(j=1 to 13) between the images of the first line pattern element $P_V$ and the second line pattern element $P_H$ and the like, and the computation results are sent to main controller 50 of exposure apparatus 100.

Then, based on the measurement results above, adjustment of exposure apparatus 100 is performed as is previously described. Accordingly, it becomes possible to adjust the pattern transfer characteristic of exposure apparatus 100 with good accuracy.

Incidentally, in the embodiment above, measurement mark $MP_j$ of measurement reticle $R_T$ is transferred onto the wafer for a predetermined number of shots without rotating the wafer during the transfer. And, after the development of the wafer, when size measurement of a resist image (mark) $M_j$ on the wafer that has undergone development is performed using SEM system 80, the measurement can be performed two times. In this case, as an example, the measurement can be performed in the following procedure.

1) For example, in a first state where the wafer faces the reference direction, SEM system 80 imports a first image of marks $M_1$ to $M_{13}$.
2) Next, the wafer is taken out from the sample chamber, and in a state where the wafer is rotated by a predetermined angle $\alpha$ (=90 degrees) from the first state described above, the wafer is returned to the sample chamber. In this state (a second state), SEM system 80 imports a second image of marks $M_1$ to $M_{13}$.
3) Then, instructions are given to SEM system 80, and the image processing accompanied by the edge detection processing is performed on the first image, and a first size (that is, the line width of a first element of mark $M_j$ (a first line element, a first section) of Mark $M_j$) of mark $M_j$ in a first direction orthogonal to the reference direction is measured.
4) Next, instructions are given to SEM system 80, and the image processing accompanied by the edge detection processing is performed on the second image, and a second size (that is, the line width of a second element of mark $M_j$ (a second line element, a second section) of Mark $M_j$) in a second direction rotated by an angle $\alpha$ (=90 degrees) to the first direction of mark $M_j$ is measured.

When the measurement is performed in the manner described above, the image processing accompanied by the edge detection processing is performed on the first image of mark $M_j$ imported by SEM system 80 in the first state where the wafer faces the reference direction, and the first size of mark $M_j$ related to the first direction orthogonal to the reference direction is measured. Further, in the second state where the wafer is rotated by a predetermined angle $\alpha$ (=90 degrees) from the first state described above, the image processing accompanied by the edge detection processing is performed on the second image of mark $M_j$ imported by SEM system 80, and the second size of mark $M_j$ related to the second direction is measured. That is, the image processing accompanied by the edge detection processing is performed according to the direction of the wafer when the image is imported by SEM system 80, which can prevent deterioration in size measurement accuracy that occurs due to the combination of image import and image processing.

In SEM system 80, taking out the wafer from the sample chamber during the measurement in most cases is actually accompanied by difficulties, when considering, for example, the measurement time. Accordingly, this method of rotating the wafer during the measurement is effective, especially in the case where measurement is performed using other measurement units such as optical microscopes or the like.

However, if a mechanism for rotating the wafer can be attached to SEM system 80, the method described above can be applied.

Further, in the embodiment above, the case has been described where the second line pattern element extends in a direction rotated by angle $\alpha$ (equals 90 degrees) with respect to the first line pattern element that constitutes measurement mark $MP_j$ on measurement reticle $R_T$, however, angle $\alpha$ referred to above can be any angle as long as the range of the angle satisfies $0° < \alpha < 180°$. More specifically, when the measurement mark consists of patterns including the first line pattern element and the second line pattern element, the first line element and the second line element only have to extend in different directions. However, in the case angle $\alpha$ is an angle besides 90 degrees, instead of step 218 previously described, a processing of a step where the wafer holder is rotated by an angle $\alpha$ has to be performed, and the direction of the line that connects the center and the notch of measurement wafer $W_T$ after rotation has to coincide with the extending direction of the second line pattern element on the measurement reticle. In this case, wafer $W_T$ before the rotation is set so that the direction of the line that connects the center and the notch of measurement wafer $W_T$ coincides with the extending direction of the first line pattern.

Incidentally, mark $M_j$ is formed on wafer $W_T$ by a first exposure of shot areas $SA_1$ to $SA_{24}$ in which in shot areas $SA_1$, to $SA_{24}$, the measurement direction (or the extending direction, periodic direction or the like) of at least one of the first and second elements of mark $M_j$ substantially coincides with one of the two different directions whose transfer characteristic are to be measured (the first and the second directions, normally the X, Y directions), and by a second exposure of shot areas $SA_{25}$ to $SA_{48}$ in which in shot areas $SA_{25}$ to $SA_{48}$, the measurement direction of at least the other one of the first and second elements of mark $M_j$ substantially coincides with the other direction of the two different directions whose transfer characteristics are to be measured. When forming mark $M_j$, it is preferable that the intersecting angle in the measurement direction (or the extending direction, periodic direction or the like) of the first and second mark elements (vertical line pattern element $P_V$ and horizontal line pattern element $P_H$) of measurement mark $MP_j$ on reticle $R_T$ is almost equal to the intersecting angle of the two different directions described earlier. In this case, by making each of the measurement directions of the first and second mark element of measurement mark $MP_j$ almost coincide with the two different directions and performing the first and second exposures, the transfer conditions of the exposure apparatus including measurement mark $MP_j$ can be set the same except for the position of the rotational direction (rotational angle) of wafer $W_T$ in the first exposure and the second exposure, and it becomes possible to measure the line width (size) of mark $M_j$, which is the transferred image of measurement mark $MP_j$, on wafer $W_T$ in the two different directions each with good accuracy. The intersecting angle in the measurement direction of first and second mark elements of measurement mark $MP_j$ on reticle $R_T$ does not necessarily have to coincide with the intersecting angle of the two different directions. In this case, in the first exposure, the measurement direction can be made to coincide with one of the two different directions with only one of the first and second mark elements, while in the second exposure, the measurement direction can be made to coincide with the other direction of the two different directions with only the other one of the first and second mark elements.

Further, in the embodiment above, wafer $W_T$ is rotated only by the same angle as the intersecting angle of the two different directions so that the measurement direction substantially coincides in one of the first and second elements of mark (the first mark) $M_j$ formed by the first exposure and the other one of the first and second elements of mark (the second mark) $M_j$ formed by the second exposure, or more specifically, so that the first mark $M_j$ and the second mark $M_j$ on wafer $W_T$ rotate only at substantially the same angle as the intersecting angle of the two different directions whose transfer characteristics are to be measured. However, in the first exposure previously described, when one of the first and second mark elements of measurement mark $MP_j$ substantially coincides with one of the two different directions, and in the second exposure previously described, when the other one of the first and second mark elements of measurement mark $MP_j$ also substantially coincides with the other direction of the two different directions, the rotational angle of wafer $W_T$ does not have to be made to coincide with the intersecting angle of the two different directions. In this case, when the rotational angle (rotational error) between the measurement direction of one of the first and second elements of the first mark $M_j$ and the measurement direction of the other one of the first and second elements of the second mark $M_j$ exceeds the permissible value related to the rotational direction, it is preferable to rotate wafer $W_T$ by SEM system 80.

Further, in the embodiment above, the case has been described where measurement mark $MP_j$ on measurement reticle $R_T$ consists of the first line pattern element and the second lien pattern element, and mark $M_j$, which is the transferred image of measurement mark $MP_j$ on wafer $W_T$, consists of the first element (the first section, the first line element), which is the image of the first line pattern element, and the second element (the second section, the second line element), which is the image of the second line pattern element. However, the mark subject to size measurement is not limited to a combination of line patterns, and the marks can be a bar-shaped mark or a polygonal-shaped mark (e.g. both marks can have a square-shape), or the first element and the second element of mark $M_j$ can connect, intersect, or partially overlay each other. Further, the mark is not limited to an isolated pattern, and can also be a dense pattern (e.g. a periodic pattern such as a line-and-space pattern). The point is, as long as size measurement related to the two crossing directions can be performed, the shape of the mark can be any shape.

In the case, for example, a rectangular (square) shaped mark is used as the element of mark $M_j$ (measurement mark $MP_j$ of reticle $R_T$) on wafer $W_T$, even if mark $M_j$ consists of only one rectangular shaped mark, because the line width (size) of mark $M_j$ can be measured in the two different directions previously described, the first and second elements (the first and second mark elements of measurement mark $MP_j$) of mark $M_j$ is to be the same element (such as the rectangular shaped mark).

Further, in the embodiment described above, the line width (size) of mark $M_j$ was measured in both the X and Y directions. However, the measurement direction of the line width can be two different directions that has at least one direction different from the X and Y directions, or, the measurement directions can be three or more instead of two, such as, for example, a total of four directions, further measuring two directions in which the X and Y directions are rotated by an angle of 45 degrees. In this case, the number of elements of mark $M_j$ (measurement mark $MP_j$ of reticle $R_T$) used for line width measurement will be four (however, two in a rectangular shaped mark) instead of two.

Further, in the embodiment described above, the case has been described where the SEM system is used as the measurement unit; however, it is a matter of course that the present invention is not limited to this. As the measurement unit, the present invention can naturally also use a measurement unit of a charged particle beam scanning type that scans the measurement subject with charged particle beams besides electron beams when performing measurement, or other measurement units such as an optical microscope. Further, the measurement unit is not limited to a unit by the image processing system, and other systems can be used. Furthermore, for example, the present invention is especially effective in the case of using a measurement unit that can independently measure the line width in both the X and Y directions, especially when using a measurement unit whose measurement method, structure or the like differs in the X direction and the Y direction.

In the embodiment above, after the first transfer step (step 212) for forming the first transferred image of measurement mark $MP_j$ on wafer $W_T$, the wafer holder was rotated (step 218), and then the second transfer step (step 224) for forming the second transferred image of measurement mark $MP_j$ at a different position on wafer $W_T$ was performed, and the transferred images on the wafer were measured by the SEM. The present invention, however, is not limited to this. That is, instead of rotating the wafer holder, a rotatable reticle holder can be arranged on reticle stage RST and the holder can be rotated, or both the wafer holder and the reticle holder can be rotated.

Further, instead of rotating the holder itself, a support member (e.g. a center up pin that delivers the wafer between a carrier system (loader) and a holder) that can move vertically while holding the wafer can be made rotatable, or instead of making the support member rotatable or in combination with the support member, the wafer can be rotated by changing the place on which the wafer is mounted using the loader or an exclusive mechanism.

Further, in the embodiment above, shot areas $SA_1$ to $SA_{24}$ formed by the first exposure and the shot areas $SA_{25}$ to $SA_{48}$ formed by the second exposure are disposed on the right and left areas on wafer $W_T$ in FIG. 6B, however, the there may be a possibility of the line width measurement accuracy deteriorating due to the uneven coating of the resist (unevenness in the resist film thickness) coated on the surface. Therefore, for example, by alternately disposing the shot area formed by the first exposure and the shot area formed by the second exposure on the wafer, deterioration in the measurement accuracy due to uneven coating can be preferably reduced.

Furthermore, in the embodiment above, the plurality of shot areas on which measurement mark $MP_j$ of reticle $R_T$ was transferred were disposed so that they did not overlay each other. However, the shot areas may be disposed partially overlaying each other on the wafer, as long as one of the first and second elements of the first mark $M_j$ formed by the first exposure previously described and the other one of the first and second elements of the second mark $M_j$ formed by the second exposure previously described that are subject to the line width measurement do not overlay each other. Further, in the embodiment described above, the transferred image of measurement mark $MP_j$ of reticle $R_T$ was formed in a plurality of shot areas in the first and second exposures, however, the number of shots does not have to be a plurality of shot areas and one shot area is acceptable, and the number of shot areas does not have to be the same in the first and second exposures. Incidentally, the first mark element and the second mark element of measurement mark $MP_j$ of reticle $R_T$ used for measuring the transfer characteristics previously described have the same configuration and also the same transfer conditions except for the arrangement direction (measurement direction), however, at least one of the configuration and the transfer conditions can be changed. Further, instead of using reticle $R_T$ used exclusively for measurement, measurement marks $MP_j$ described earlier can be formed on the reticle used for manufacturing devices. Furthermore, a transferred image of a plurality measurement marks $MP_j$ was formed per each shot area $SA_n$ previously described, however, the arrangement (the position of the measurement marks within the shot area) of the measurement marks is not limited to this, and the arrangement can be optional and the number of marks does not have to be a plurality of marks and one mark is acceptable. Further, not only can the reticle used exclusively for measurement or the reticle for manufacturing devices be used, but also for example, fiducial marks arranged on reticle stage RST can be used as measurement mark $MP_j$.

Further, in the embodiment above, as the transfer characteristics of the exposure apparatus, the V/H difference and the in-plane uniformity were obtained, however, the transfer characteristics are not limited to this, and the transfer characteristics can be, for example, the image forming characteristics (various aberrations such as coma and astigmatism) of projection optical system PL or the synchronous accuracy (synchronous error) in the scanning exposure. Furthermore, by using a periodic pattern such as a line-and-space pattern as the mark element of measurement mark $MP_j$ of reticle $R_T$, and respectively measuring the line width of the transferred image of the plurality of images, the difference between the maximum value and the minimum value of the line width can be obtained, for example, as the line width variation. Further, measurement mark $MP_j$ of reticle $R_T$ can be overlaid and transferred on a mark, which is already formed on the wafer, and for example, by measuring the relative position (such as the spacing) between the two marks, the overlay accuracy (total overlay) can be obtained as the transfer accuracy.

Further, in the embodiment above, the transferred image of measurement mark $MP_j$ was formed on the wafer by scanning exposure, and by measuring the size of the transferred image, various characteristics (dynamic image forming characteristics and the like) of the scanning exposure apparatus (exposure apparatus 100) used to form the transferred image were obtained. However, various characteristics (static image forming characteristics and the like) of exposure apparatus 100 can also be obtained as in the embodiment described above by performing exposure in a state where measurement reticle $R_T$ (and reticle stage RST that holds reticle $R_T$) on which measurement mark $MP_j$ is formed and the wafer (and wafer stage WST that holds the wafer) are substantially static, forming a transferred image of measurement mark $MP_j$ on the wafer, and measuring the size of the transferred image.

Furthermore, in the embodiment above, the image-forming characteristics of projection optical system PL were adjusted by moving at least one optical element (lens element) of projection optical system PL based on the transfer characteristics previously described. However, as image forming quality correction controller 48 described earlier, the adjustment is not limited only to moving the optical elements, and instead of moving the optical elements or in combination with such an operation, the refractive index of the projection optical system can be changed, for example, by changing the center wavelength of the illumination light or the temperature of the optical element or by changing the gas pressure within the airtight space in between a plurality of optical elements. Furthermore, in order to adjust the image-forming characteristics of the projection optical system, for example, the whole projection optical system or a part of the projection optical system (by an optical element unit, a barrel unit or the like) can be switched, or at least one optical element of the projection optical system can be taken out and reprocessed. Further, in the adjustment of the projection optical system, the adjustment can be made only by adjusting the position (including the spacing with other optical elements) or the gradient of the optical element, or especially when the optical element is a lens element the decentration can be changed or the lens element can be rotated with the optical axis serving as the center. Furthermore, when the image-forming characteristics of the projection optical system is to be obtained as the transfer characteristics previously described, as is disclosed in, for example, the pamphlet of International Publication No. WO03/065428 and the like, wavefront aberration of the projection optical system can be estimated based on a known wavefront aberration (stand-alone or surface aberration) of projection optical system PL by itself, and by solving a predetermined merit function using the wavefront aberration, a Zernike sensitivity chart, a wavefront aberration variation table (a variation table that shows a relation between each optical element and the variation amount of a coefficient of each term in a Fringe Zernike polynomial, which is an expansion of the wavefront aberration per unit drive amount of each optical element) and the like, the drive amount of the optical element for optimizing the image-forming characteristics can be obtained, which makes it possible to perform the adjustment of the image-forming characteristics. Incidentally, in the case of estimating the wavefront aberration from the measurement results of the image-forming characteristics, as is disclosed in, for example, the pamphlet of the International Publication described above, the correction amount of the wavefront aberration is obtained using a relational expression in which the difference in the image-forming characteristics under a reference exposure condition and the image-forming characteristics that are actually measured coincides with the product of the Zernike sensitivity chart, the wavefront aberration variation table, and the correction amount of the adjustment amount ( ), and based on the difference between the adjustment amount and the stand-alone wavefront aberration, the wavefront aberration is computed.

Incidentally, the measurement of the transfer characteristics (and the adjustment of the exposure apparatus) in the embodiment above can be performed during the maintenance period of the exposure apparatus, or the measurement can be performed when installing and setting up the exposure apparatus in the clean room; that is, the timing is optional.

Incidentally, in the embodiment above, the case has been described where the processing on and after the pattern transfer of the wafer includes manual operation by the operation. However, exposure apparatus 100 and SEM system 80 can be connected via the in-line interface section, which incorporates the wafer carrier system, and a host computer that has overall control over all of exposure apparatus 100, SEM system 80, and the in-line interface section can be arranged. In this case, by the program executed by the host computer, the transfer of the pattern of measurement reticle $R_T$ on to the measurement wafer previously described, the development of the measurement wafer after the transfer, the carriage of the measurement wafer that has been developed to SEM system 80 via the in-line interface section, the measurement by SEM system 80, and the adjustment of the pattern transfer characteristics of exposure apparatus 100 can all be performed automatically. Or, on the contrary, the operator can perform all the above operations manually.

Further, in the embodiment above, main controller 50 of exposure apparatus 100 controlled the C/D, however, for example, the host computer or the like that controls the device manufacturing process can have overall control over exposure apparatus 100, the C/D, and the SEM system, and exposure apparatus 100 and the SEM system does not have to be connected via the communication path (wired or wireless). That is, the configuration of both exposure apparatus 100 and the SEM system (including the communication path) is not limited to the ones described in the embodiment above.

Incidentally, in the embodiment above, the case has been described where the exposure apparatus in which the pattern transfer characteristics is measured is a scanner, however, the transfer characteristic measurement method of the present invention is not limited to scanners and can also be applied similarly to static exposure apparatus such as a stepper.

Further, the object subject to exposure of the exposure apparatus is not limited to a wafer for manufacturing semiconductor devices as in the embodiment above, and for example, the object can be a square shaped glass plate for manufacturing display units such as a liquid crystal display device, a plasma display, or an organic EL, or a substrate for manufacturing a thin-film magnetic head, an imaging device (such as a CCD), or a mask or a reticle.

Further, the magnification of the projection optical system in the exposure apparatus in the embodiment above is not limited to a reduction system, and the magnification can be an equal magnifying system or a magnifying system, and projection optical system PL is not limited to a refracting system, and can also be a reflection system or a catodioptric system, and the projected image can be either an inverted image or an upright image.

Further, illumination light IL can be an ArF excimer laser beam (wavelength: 193 nm), a KrF excimer laser beam (wavelength: 248 nm), an $F_2$ laser beam (wavelength: 157 nm) or the like. As the projection optical system, in the case of using far ultraviolet light such as the KrF excimer laser beam, the ArF excimer laser beam or the like, materials that transmit the far ultraviolet light such as quartz, fluorite and the like are used as the glass material, and in the case of using the $F_2$ laser beam or the like, materials such as fluorite or other fluoride crystals have to b used.

Further, in the embodiment above, the light used as illumination light IL in the exposure apparatus is not limited to light having a wavelength that exceeds 100 nm, and it is a matter of course that light having a wavelength less than 100 nm can also be used. For example, in recent years, in order to expose a pattern of 70 nm or under, an EUV exposure apparatus is being developed that generates an EUV (Extreme Ultraviolet) light in the soft X-ray region (e.g. wavelength range of 5 to 15 nm) using an SOR or a plasma laser as a light source and uses an all reflection reduction optical system, which is designed based on the exposure wavelength (e.g. 13.5 nm), and a reflection typed mask. In this apparatus, since the structure in which the mask and the wafer are synchronously scanned using a circular illumination to perform the scanning exposure can be taken into consideration, the transfer characteristics of the pattern can also be measured according to the transfer characteristic measurement method of the present invention in the apparatus. Furthermore, the transfer characteristics of the pattern can also be measured according to the transfer characteristic measurement method of the present invention in an immersion exposure apparatus in which liquid (e.g. pure water) is filled in the space between projection optical system PL and the wafer as is disclosed in, for example, the pamphlet of International Publication No. WO99/49504 or the like, in an exposure apparatus by the step-and-stitch method, a proximity exposure apparatus or the like.

Further, the present invention can also be applied to a maskless exposure apparatus that uses a variable-shaped mask whose intensity distribution of the illumination light is variable on the object surface of projection optical system PL, and the transfer characteristics of the pattern can be obtained in a similar manner.

Further, the transfer characteristics of the pattern can also be measured according to the transfer characteristic measurement method of the present invention in an exposure apparatus that uses a charged particle beam such as an electron beam or an ion beam. Incidentally, the electron beam exposure apparatus can be an apparatus by any one of a pencil beam method, a variable-shaped beam method, a self-projection method, a blanking aperture array method, and a mask projection method.

Incidentally, the semiconductor device is manufactured through the step of performing the function and performance design of the device, the step of manufacturing the reticle based on the design step, the step of preparing the wafer from silicon material, the step of transferring the pattern formed on the mask onto the photosensitive object by the exposure apparatus in the embodiment above whose pattern transfer characteristics have been adjusted by the adjustment method previously described, the step of assembling the device (including dicing process, bonding process, packaging process), and the inspection step. In this case, since the exposure apparatus in the embodiment above whose pattern transfer characteristics have been adjusted is used in the lithography step, highly integrated devices can be manufactured with good yield.

INDUSTRIAL APPLICABILITY

As is described above, the measurement method of the present invention is suitable for measuring size information of a mark formed on an object. Further, the transfer characteristic measurement method of the present invention is suitable for measuring the pattern transfer characteristics of the exposure apparatus. Further, the adjustment method of the present invention is suitable for adjusting the exposure apparatus. Further, the device manufacturing method of the present invention is suitable for manufacturing a device.

What is claimed is:

1. A measurement method in which size information related to at least two directions of a mark formed on an object is measured, the method comprising:

a first image import process in which a first image of the mark is imported by a measurement unit in a first state where the object is set to a reference direction;

a second image import process in which a second image of the mark is imported by the measurement unit in a second state where at least a part of the mark is rotated by a predetermined angle $\alpha(0°<\alpha<180°)$ from the first state;

a first measurement process in which an image processing accompanied with an edge detection process is applied to the first image and a first size related to a first direction orthogonal to the reference direction of the mark is measured; and a second measurement process in which an image processing accompanied with an edge detection process is applied to the second image and a second size related to a second direction rotated by the angle $\alpha$ with respect to the first direction of the mark is measured.

2. The measurement method of claim 1 wherein the mark is arranged on a plurality of positions on the object, and in the first image import process and the second image import process, a plurality of mark images are imported, and in the first measurement process and the second measurement process, the first size and the second size are measured for each of the plurality of marks.

3. The measurement method of claim 1 wherein the mark contains a first line element that extends in the reference direction and a second line element that extends in a direction rotated by the angle $\alpha$ with respect to the reference direction, and the first size of the mark is the size of the first line element in the width direction and the second size of the mark is the size of the second line element in the width direction.

4. The measurement method of claim 1 wherein the mark contains a first element and a second element that are arranged to make a measurement direction of the size intersect at the predetermined angle α on the object, and in order to measure the size of the first element related to the first direction as the first size of the mark, at least an image of the first element whose measurement direction is substantially orthogonal to the reference direction is imported as the first image in the first state, and in order to measure the size of the second element related to the second direction as the second size of the mark, at least an image of the second element whose measurement direction is substantially orthogonal to the reference direction is imported as the second image in the second state.

5. The measurement method of claim 4 wherein after the object is arranged within the measurement unit so that the measurement direction of the first element is arranged substantially orthogonal to the reference direction and the first image has been imported, the object is rotated substantially by the predetermined angle α and the second image is imported.

6. The measurement method of claim 4 wherein the mark contains at least one first mark containing the first element and the second element and at least one second mark whose first element and second element are rotated substantially by the predetermined angle a with respect to the first mark, and an image import of at least the first element of the first mark in the first state and an image import of at least the second element of the second mark in the second state are performed without substantially rotating the object.

7. The measurement method of claim 6 wherein the first mark and the second mark are each formed on the object under the same conditions except for the position of the object in the rotational direction.

8. The measurement method of claim 1 wherein the angle α is 90 degrees.

9. The measurement method of claim 1 wherein the mark is a transferred image of a predetermined measurement mark transferred onto the object by an exposure apparatus.

10. The measurement method of claim 9 wherein the mark is formed at different positions within the same area on the object in one exposure operation by the exposure apparatus, and each of a transfer characteristic related to different directions of the exposure apparatus is obtained based on a mark size measured at each of the positions.

11. The measurement method of claim 9 wherein the mark is formed in different areas on the object in a plurality of exposure operations by the exposure apparatus, and each of a transfer characteristic related to different directions of the exposure apparatus is obtained based on a mark size measured in the different areas.

12. The measurement method of claim 9 wherein the mark is formed on different areas of the object in a first exposure performed at least once by the exposure apparatus and a second exposure performed at least once in which the rotational angle of the object substantially differs by the predetermined angle α from the first exposure, and at least a part of the mark formed by the first exposure is imported as the first image and at least a part of the mark formed by the second exposure is imported as the second image.

13. The measurement method of claim 12 wherein transfer conditions of the exposure apparatus including the measurement mark are set the same in the first exposure and the second exposure, and at least a first segment of the mark formed by the first exposure is imported as the first image and at least a second segment of the mark different from the first segment formed by the second exposure is imported as the second image.

14. The measurement method of claim 13 wherein the first segment and the second segment substantially have the same configuration, and the number of exposures of the first exposure and the second exposure is almost the same.

15. The measurement method of claim 12 wherein the first exposure and the second exposure are each performed a plurality of times, and a plurality of a first area where marks are formed in the first exposure and a plurality of a second area where marks are formed in the second exposure are substantially alternately arranged on the object.

16. The measurement method of claim 1 wherein the measurement unit is a charged particle beam scanning measurement unit.

17. A transfer characteristic measurement method in which a transfer characteristic related to two different directions of an exposure apparatus that transfers a pattern formed on a mask onto an object is measured, the method comprising:
a transfer process in which a mark containing a first element and a second element used to measure the transfer characteristic in the two directions is formed using the exposure apparatus;
an image import process in which the object is set to a reference direction within a measurement unit and a first image, which is at least a part of the mark containing one element of the first element and the second element, is imported along with a second image, which is at least a part of the mark containing the other element of the first element and the second element; and
a measurement process in which the first image and the second image are processed and a first size and a second size related to the two directions of the mark are respectively measured, wherein
in the image import process, the second image is imported, the second image being at least a part of the mark containing the other element whose rotational angle differs from the one element when the first image is imported, by an angle α(0°<α<180°) that is substantially the same as an intersecting angle of the two directions, and
the measurement process includes an edge detection process that processes the first and second images of the mark.

18. The transfer characteristic measurement method of claim 17 wherein the second image import is performed after the first image has been imported by the measurement unit and the object has been rotated substantially at the angle α.

19. The transfer characteristic measurement method of claim 17 wherein in the transfer process, the mark is formed each on different areas of the object in a first exposure performed at least once by the exposure apparatus and a second exposure performed at least once by the exposure apparatus in which the rotational angle of the object substantially differs by the predetermined angle α from the first exposure, and in the image import process, after at least one of the first element and the second element of a first mark formed in the first exposure has been imported as the first image, at least the other element of the first element and the second element of a second mark formed in the second exposure is imported as the second image without substantially rotating the object.

20. The transfer characteristic measurement method of claim 19 wherein in the first exposure and the second exposure, transfer conditions of the exposure apparatus including a predetermined measurement mark are set the same, and in both the first mark and the second mark the configuration of the first element and the second element is substantially the same.

21. The transfer characteristic measurement method of claim 19 wherein the first exposure and the second exposure are each performed a plurality of times, and a size of the one mark obtained from the plurality of image processing of the first mark is to be decided as a first size related to one of the two directions, and a size of the other mark obtained from the plurality of image processing of the second mark is to be decided as a second size related to the other one of the two directions.

22. An adjustment method of an exposure apparatus, the method comprising:

a measurement process in which a pattern transfer characteristic of the exposure apparatus that transfers a pattern formed on a mask onto an object is measured using the transfer characteristic measurement method of claim 17; and an adjustment process in which the exposure apparatus is adjusted based on results of the measurement.

23. The adjustment method of the exposure apparatus of claim 22 wherein the exposure apparatus has a projection optical system that projects an image of the pattern on the object, and the transfer characteristic includes an image-forming characteristic of the projection optical system.

24. A device manufacturing method that includes a transfer process in which a pattern formed on the mask is transferred on a photosensitive object using the exposure apparatus whose pattern transfer characteristic has been adjusted according to the adjustment method of claim 22.

25. A transfer characteristic measurement method in which a pattern transfer characteristic of an exposure apparatus that transfers a pattern formed on a mask onto an object is measured, the method comprising:

a first transfer process in which a measurement mask that has a pattern area where at least one predetermined measurement mark is formed is loaded into the exposure apparatus and exposure is performed to transfer the pattern area onto the object;

a second transfer process in which the pattern area is transferred onto the object in a state where at least one of the measurement mask and the object is rotated so that an angle of the object with respect to the measurement mask is altered at a predetermined angle α(0°<α<180°) from the first transfer process;

an image import process in which an image of a first transferred image of the measurement mark formed on the object in the first transfer process and an image of a second transferred image of the measurement mark formed on the object in the second transfer process are imported by the measurement unit in a state where the object is set to a reference direction; and a measurement process in which an image processing accompanied by an edge detection processing is applied to the image of the first transferred image and the image of the second transferred image that have been imported, and at least a size is measured related to a measurement direction orthogonal to a direction corresponding to the reference direction of each of the first transferred image of the measurement mark and the second transferred image of the measurement mark.

26. The transfer characteristic measurement method of claim 25 wherein in the measurement process, each of the size related to the measurement direction is measured with a part of the transferred image of the measurement mark formed in the first transfer process serving as the first transferred image, and a part of a transferred image of the measurement mark formed in the second transfer process different from the first transferred image also serving as the second transferred image.

27. The transfer characteristic measurement method of claim 25 wherein the measurement mark contains a first mark element and a second mark element that are different from each other, and at least a part of a transfer area of the measurement mark is made to differ in the first transfer process and the second transfer process so that one transferred image of the first mark element and the second mark element formed in one of the first transfer process and the second transfer process and the other transferred image of the first mark element and the second mark element formed in the other process of the first transfer process and the second transfer process do not overlay each other on the object.

28. The transfer characteristic measurement method of claim 25 wherein the measurement mark contains a first mark element and a second mark element that are different from each other, and in the measurement process, each of the size related to the measurement direction is measured with a transferred image of one of the first mark element and the second mark element formed in the first transfer process serving as the first transferred image and a transferred image of the other one of the first mark element and the second mark element formed in the second transfer process serving as the second transferred image.

29. The transfer characteristic measurement method of claim 25 wherein the size of the transferred image of the measurement mark related to a first direction and a second direction that intersect each other of the exposure apparatus is respectively decided, based on results of the measurement.

30. The transfer characteristic measurement method of claim 25 wherein in the first transfer process and the second transfer process, the pattern area is respectively transferred onto a plurality of different places on the object, and in the image import process, a plurality of the first transferred images of the measurement mark each transferred onto a plurality of different places on the object in the first transfer process and a plurality of the second transferred images of the measurement mark each transferred onto a plurality of different places on the object in the second transfer process are imported, and in the measurement process, the image processing of each of the plurality of the first transferred images and the plurality of the second transferred images is performed, and the size related to the measurement direction is decided for each of the first transferred image and the second transferred image.

31. The transfer characteristic measurement method of claim 25 wherein
the measurement mark contains a first mark element and a second mark element that are different from each other, and in the measurement process, each of the size related to the measurement direction is measured with a transferred image of one of the first mark element and the second mark element formed in the first transfer process serving as the first transferred image and a transferred image of the other one of the first mark element and the second mark element formed in the second transfer process serving as the second transferred image, and according to results of the measurement, variation of the size is obtained.

32. The transfer characteristic measurement method of claim 25 wherein
on the measurement mask, the measurement mark is formed in a plurality of numbers at different positions within the pattern area, whereby
in the image import process, an image of the first transferred image of the measurement mark formed on the object in the first transfer process and an image of the second transferred image of the measurement mark formed on the object in the second transfer process are imported for each of the measurement marks in a plurality of numbers, and
in the measurement process, based on the size related to the measurement direction of the first transferred image and the second transferred image of the measurement marks in a plurality of numbers, an in-plane uniformity of the size related to the measurement direction of both the first transferred image and the second transferred image is further measured.

33. The transfer characteristic measurement method of claim 25 wherein
in the first transfer process and the second transfer process, transfer conditions of the exposure apparatus including a predetermined measurement mark are set the same, and the measurement mark contains a first mark element and a second mark element that substantially have the same configuration so as to measure each of the transfer characteristic related to a first direction and a second direction that intersects each other of the exposure apparatus.

34. The transfer characteristic measurement method of claim 25 wherein
the measurement mark is formed within the pattern area at a plurality of different positions, and in each of the first transfer process and the second transfer process, transfer of the pattern area is performed a plurality of times, and in the measurement process, the size of both the first transferred image and the second transferred image of each measurement mark related to the measurement direction is measured in each of the plurality of areas on the object on which the pattern area is transferred.

35. The transfer characteristic measurement method of claim 25 wherein
the measurement mark contains a first line pattern element that extends in the reference direction and a second line pattern element that extends in a direction rotated by the angle $\alpha$ with respect to the reference direction, and the size of the first transferred image of the measurement mark related to the measurement direction is the size of the transferred image of the first line pattern element in the width direction, and the size of the second transferred image of the measurement mark related to the measurement direction is the size of the transferred image of the second line pattern element in the width direction.

36. The transfer characteristic measurement method of claim 25 wherein
the angle $\alpha$ is 90 degrees.

37. The transfer characteristic measurement method of claim 25 wherein
the measurement unit is a charged particle beam scanning measurement unit.

38. An adjustment method of an exposure apparatus, the method comprising:
a measurement process in which a pattern transfer characteristic of the exposure apparatus that transfers a pattern formed on a mask onto an object is measured using the transfer characteristic measurement method of claim 25; and
an adjustment process in which the exposure apparatus is adjusted based on results of the measurement.

39. The adjustment method of the exposure apparatus of claim 38 wherein
the exposure apparatus has a projection optical system that projects an image of the pattern on the object, and the transfer characteristic includes an image-forming characteristic of the projection optical system.

40. A device manufacturing method that includes a transfer process in which a pattern formed on the mask is transferred on a photosensitive object using the exposure apparatus whose pattern transfer characteristic has been adjusted according to the adjustment method of claim 38.

41. A transfer characteristic measurement method in which a transfer characteristic related to a first direction and a second direction that intersect each other of an exposure apparatus that transfers a pattern formed on a mask onto an object is measured, the method comprising:
a formation process in which a mark containing a first element whose measurement direction substantially coincide with the first direction and a second element whose measurement direction substantially coincide with the second direction is formed on the object using the exposure apparatus; and
a measurement process in which a size related to the measurement direction is measured and the first element and the second element of the mark formed on the object are detected, wherein the measurement process includes an edge detection process that processes a first image of the first element and a second image of the second element with the measurement directions being almost in the same direction as each other within a measurement unit.

42. An adjustment method of an exposure apparatus, the method comprising:
a measurement process in which a pattern transfer characteristic of the exposure apparatus that transfers a pattern formed on a mask onto an object is measured using the transfer characteristic measurement method of claim 41; and
an adjustment process in which the exposure apparatus is adjusted based on results of the measurement.

43. The adjustment method of the exposure apparatus of claim 42 wherein
the exposure apparatus has a projection optical system that projects an image of the pattern on the object, and the transfer characteristic includes an image-forming characteristic of the projection optical system.

44. A device manufacturing method that includes a transfer process in which a pattern formed on the mask is transferred on a photosensitive object using the exposure apparatus whose pattern transfer characteristic has been adjusted according to the adjustment method of claim 42.

45. A transfer characteristic measurement method in which a transfer characteristic related to a first direction and a second direction that intersect each other of an exposure apparatus that transfers a pattern formed on a mask onto an object is measured, the method comprising:

a formation process in which a mark containing a first element and a second element whose measurement directions substantially coincide with the first direction and the second direction, respectively, is formed as a first mark and a second mark whose rotational angle differs at substantially the same angle as an intersecting angle of the first direction and the second direction on the object using the exposure apparatus; and a measurement process in which one of the first element and the second element of the first mark formed on the object and the other of the first element and the second element of the second mark formed on the object whose measurement direction substantially coincides with the one of the first element and the second element of the first mark are detected, and a size of the first element of the mark and a size of the second element of the mark related to the measurement direction are respectively measured, wherein the measurement process includes an edge detection process that processes a first image of the first element and a second image of the second element.

46. An adjustment method of an exposure apparatus, the method comprising:

a measurement process in which a pattern transfer characteristic of the exposure apparatus that transfers a pattern formed on a mask onto an object is measured using the transfer characteristic measurement method of claim 45; and an adjustment process in which the exposure apparatus is adjusted based on results of the measurement.

47. The adjustment method of the exposure apparatus of claim 46 wherein the exposure apparatus has a projection optical system that projects an image of the pattern on the object, and the transfer characteristic includes an image-forming characteristic of the projection optical system.

48. A device manufacturing method that includes a transfer process in which a pattern formed on the mask is transferred on a photosensitive object using the exposure apparatus whose pattern transfer characteristic has been adjusted according to the adjustment method of claim 46.

* * * * *